(12) United States Patent
Peddle et al.

(10) Patent No.: US 9,941,007 B2
(45) Date of Patent: Apr. 10, 2018

(54) SOLID STATE DRIVE ARCHITECTURES

(71) Applicant: THSTYME BERMUDA LIMITED, Hamilton (BM)

(72) Inventors: Charles I. Peddle, Santa Cruz, CA (US); Martin Snelgrove, Toronto (CA); Robert Neil McKenzie, Toronto (CA); Xavier Snelgrove, Toronto (CA)

(73) Assignee: Thstyme Bermuda Limited (BM)

( * ) Notice: Subject to any disclaimer, the term of this patent is extended or adjusted under 35 U.S.C. 154(b) by 0 days.

(21) Appl. No.: 14/517,318

(22) Filed: Oct. 17, 2014

(65) Prior Publication Data

US 2015/0046625 A1    Feb. 12, 2015

Related U.S. Application Data

(63) Continuation of application No. PCT/US2013/070789, filed on Nov. 19, 2013.

(60) Provisional application No. 61/728,394, filed on Nov. 20, 2012, provisional application No. 61/775,327, filed on Mar. 8, 2013.

(51) Int. Cl.
| | |
|---|---|
| G06F 9/45 | (2006.01) |
| G06F 12/08 | (2016.01) |
| G06F 12/0808 | (2016.01) |
| G06F 12/0815 | (2016.01) |
| G11C 14/00 | (2006.01) |
| G06F 12/02 | (2006.01) |
| G06F 13/28 | (2006.01) |
| G11C 11/4063 | (2006.01) |
| G11C 16/10 | (2006.01) |
| G06F 3/06 | (2006.01) |
| G11C 16/04 | (2006.01) |

(52) U.S. Cl.
CPC ...... G11C 14/0018 (2013.01); G06F 12/0246 (2013.01); G06F 13/28 (2013.01); G11C 11/4063 (2013.01); G11C 16/10 (2013.01); G06F 3/0688 (2013.01); G06F 2212/7201 (2013.01); G11C 16/0408 (2013.01)

(58) Field of Classification Search
CPC .. G06F 11/30; G06F 11/3648; G06F 12/0223; G06F 12/0238
USPC ........................................................ 711/103
See application file for complete search history.

(56) References Cited

U.S. PATENT DOCUMENTS

| | | | | |
|---|---|---|---|---|
| 6,782,410 B1 * | 8/2004 | Bhagat | .................. | G06F 9/5027 709/201 |
| 6,842,377 B2 * | 1/2005 | Takano | ................ | G11C 7/1021 365/185.21 |
| 7,017,011 B2 * | 3/2006 | Lesmanne | ............. | G06F 12/082 711/141 |
| 7,196,942 B2 * | 3/2007 | Khurana | ............... | G11C 7/1051 326/38 |
| 7,269,715 B2 * | 9/2007 | Le | .......................... | G06F 9/3802 712/215 |

(Continued)

Primary Examiner — Tuan Thai
Assistant Examiner — Mohamed Gebril
(74) Attorney, Agent, or Firm — Fabian Vancott; Steven L. Nichols

(57) ABSTRACT

A solid state drive includes DRAM logical flash and flash memory, in which system processor reads and writes only to the DRAM logical flash which minimizes writes to the flash memory. A method for operation of a solid state flash device includes writing, by a CPU, to a solid state drive by sending commands and data to DRAM logical flash using flash commands and formatting.

30 Claims, 15 Drawing Sheets

(56) References Cited

U.S. PATENT DOCUMENTS

| | | | | |
|---|---|---|---|---|
| 7,321,955 B2* | 1/2008 | Ohmura | | G06F 12/0804 711/113 |
| 7,512,736 B1* | 3/2009 | Overby | | G06F 3/0607 707/999.202 |
| 7,535,787 B2* | 5/2009 | Elmhurst | | G11C 16/3418 365/185.09 |
| 7,580,277 B2* | 8/2009 | Fuji | | G11C 11/406 365/148 |
| 7,711,890 B2* | 5/2010 | Lasser | | G06F 12/0246 711/103 |
| 7,945,825 B2* | 5/2011 | Cohen | | G06F 11/1072 714/721 |
| 8,230,193 B2* | 7/2012 | Klemm | | G06F 3/0608 711/114 |
| 8,566,546 B1* | 10/2013 | Marshak | | G06F 3/0604 711/112 |
| 8,595,449 B2* | 11/2013 | Kund | | G11C 7/04 365/113 |
| 8,990,527 B1* | 3/2015 | Linstead | | G06F 3/0617 711/161 |
| 2004/0068621 A1* | 4/2004 | Van Doren | | G06F 12/0828 711/144 |
| 2005/0125607 A1* | 6/2005 | Chefalas | | G06F 12/0862 711/113 |
| 2006/0080501 A1* | 4/2006 | Auerbach | | G06F 1/3221 711/112 |
| 2006/0202999 A1* | 9/2006 | Thornton | | G06F 12/145 345/531 |
| 2007/0008328 A1* | 1/2007 | MacWilliams | | G06F 12/0646 345/530 |
| 2007/0133331 A1* | 6/2007 | Park | | G06F 11/106 365/222 |
| 2007/0255898 A1* | 11/2007 | Nishide | | G06F 12/0866 711/113 |
| 2008/0028136 A1* | 1/2008 | Schakel | | G06F 13/1636 711/106 |
| 2008/0104314 A1* | 5/2008 | Rajan | | G06F 13/4243 711/105 |
| 2008/0250189 A1* | 10/2008 | Cheng et al. | | 711/100 |
| 2009/0094413 A1* | 4/2009 | Lehr | | G06F 3/0605 711/112 |
| 2009/0113119 A1* | 4/2009 | Oribe | | G06F 12/0804 711/103 |
| 2009/0161466 A1* | 6/2009 | Hamilton | | G11C 16/10 365/222 |
| 2009/0172257 A1* | 7/2009 | Prins | | G06F 13/1657 711/103 |
| 2009/0228648 A1* | 9/2009 | Wack | | G06F 11/1092 711/114 |
| 2009/0282101 A1* | 11/2009 | Lim | | G06F 9/5077 709/203 |
| 2010/0042773 A1* | 2/2010 | Yeh | | G06F 12/0804 711/103 |
| 2010/0046267 A1* | 2/2010 | Yan | | G11C 16/24 365/51 |
| 2010/0050016 A1* | 2/2010 | Franklin | | G06F 11/0727 714/6.32 |
| 2010/0125712 A1* | 5/2010 | Murase | | G06F 11/1458 711/162 |
| 2010/0138591 A1* | 6/2010 | Yano | | G11C 29/702 711/103 |
| 2010/0202238 A1 | 8/2010 | Moshayedi et al. | | |
| 2010/0241785 A1* | 9/2010 | Chen | | G06F 9/5016 711/6 |
| 2010/0241789 A1* | 9/2010 | Chu | | G06F 12/0246 711/103 |
| 2010/0293420 A1* | 11/2010 | Kapil | | G06F 12/08 714/710 |
| 2010/0332780 A1* | 12/2010 | Furuya | | G06F 3/0689 711/162 |
| 2011/0004722 A1* | 1/2011 | Jeddeloh | | G06F 12/00 711/103 |
| 2011/0047324 A1* | 2/2011 | Norman | | G06F 12/0246 711/103 |
| 2011/0066837 A1* | 3/2011 | Lee | | G06F 9/4401 713/2 |
| 2011/0145485 A1* | 6/2011 | Chun | | 2/246 |
| 2011/0202735 A1* | 8/2011 | Kono | | G06F 11/1451 711/162 |
| 2011/0307745 A1* | 12/2011 | McCune | | G06F 17/30221 714/54 |
| 2012/0110293 A1* | 5/2012 | Yang | | G06F 9/45558 711/170 |
| 2012/0198107 A1* | 8/2012 | McKean | | G06F 13/18 710/40 |
| 2012/0246392 A1* | 9/2012 | Cheon | | G06F 12/0871 711/103 |
| 2012/0284587 A1* | 11/2012 | Yu | | G06F 3/0608 714/773 |
| 2013/0007373 A1* | 1/2013 | Beckmann | | G06F 12/126 711/136 |
| 2013/0067161 A1* | 3/2013 | Chandra | | G06F 13/12 711/114 |
| 2013/0080805 A1* | 3/2013 | Vick | | G06F 8/4432 713/320 |
| 2013/0111129 A1* | 5/2013 | Maki | | G06F 3/0611 711/117 |
| 2013/0152097 A1* | 6/2013 | Boctor | | G06F 9/505 718/103 |
| 2013/0326270 A1* | 12/2013 | Chen | | G06F 11/2089 714/6.21 |
| 2014/0003114 A1* | 1/2014 | Pellizzer | | H01L 27/2481 365/63 |

* cited by examiner

SOLID STATE DRIVE ARCHITECTURES

RELATED APPLICATIONS

The present application claims benefit and is a continuation of International Application No. PCT/US2013/070789, filed Nov. 19, 2013, which claims the benefit of U.S. Provisional Application No. 61/728,394, filed Nov. 20, 2014 and U.S. Provisional Application No. 61/775,327, filed Mar. 8, 2013. These applications are incorporated herein by reference in their entireties.

FIELD OF THE INVENTION

This application is related to solid state drive architectures.

BACKGROUND

Computing devices preserve program executables and data in nonvolatile memory. This makes the files available to the computing devices after being restarted or after power interruptions. Traditionally, the preferred nonvolatile storage for large files has been a hard disk drive. Hard disk drives include rotating rigid platters on a motor driven spindle. Data is magnetically read from and written to the platter by heads that float on a film of air above the platters. These platters typically spin at speeds of between 4,200 and 15,000 revolutions per minute (rpm). Hard disk drives have a number of disadvantages, including access times that are related to the mechanical nature of the rotating disks and moving heads, high power consumption, mechanical failure, and low shock resistance.

Solid State Drives (SSDs) are nonvolatile storage devices that use integrated circuits to store data and consequently contain no moving parts. SSDs have a number of advantages over hard disk drives including higher shock resistance, lower access times, and more variable form factors. Additionally SSDs typically consume far less power during operation than hard disk drives. Consequently, SSDs allow for smaller, thinner device profiles and for longer operation on a battery charge.

BRIEF DESCRIPTION OF THE DRAWINGS

The accompanying drawings illustrate various examples of the principles described herein and are a part of the specification. The illustrated examples are merely examples and do not limit the scope of the claims.

Throughout the drawings, identical reference numbers designate similar, but not necessarily identical, elements.

DETAILED DESCRIPTION

Figure 1:
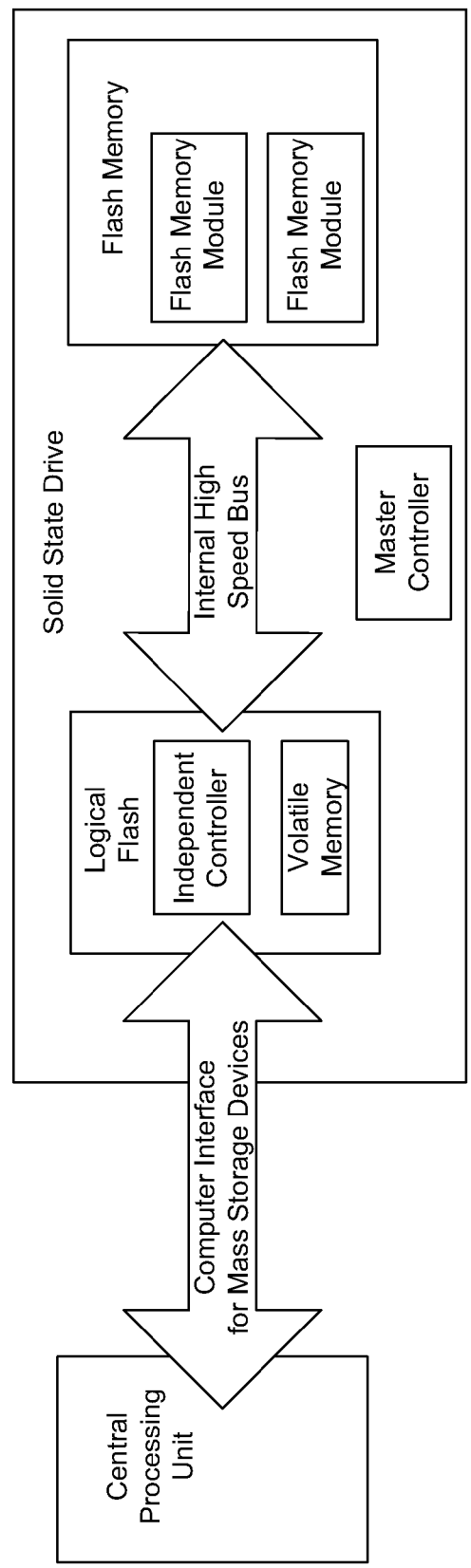
FIG. 1 is a block diagram of an illustrative solid state drive architecture, according to one example of principles described herein.

Solid State Drives (SSDs) are nonvolatile storage devices that use integrated circuits, such as NAND flash memory, to store data. SSDs have a number of advantages, such as high shock resistance, low power requirements, faster access times, and more variable form factors. However, integrated circuits that are used as memory in solid state drives have a limited lifetime. Typical specifications for NAND flash specify that NAND flash can only reliability be used for 1000-3000 write/erase cycles before failure. This lifetime limitation is particularly troublesome because, in the current architectures, a block of NAND flash must be erased and rewritten each time any part of the data contained with the block is changed. Thus, the more frequently a SSD drive is used, the faster it will fail. Many operating systems write to the non-volatile memory frequently. For example, File Access Tables (FAT tables) are rewritten every time a file changes. Each FAT table update includes multiple erase/write cycles. An alternative file system is the New Technology File System (NTFS) which is a proprietary file system developed by Microsoft® and is the default file system for the Windows® family of operating systems. NTFS has improved support for metadata, and the use of advanced data structures to improve performance, reliability, and disk space utilization, plus additional extensions, such as security access control lists (ACL) and file system journaling. NTFS writes to the SSD drive even more frequently that the FAT system. Additionally, many operating systems periodically save "snapshots" of the current state of the computing device into nonvolatile memory. While this can be beneficial in recovering the operation of the computing device, routinely saving the large snapshots on to the NAND flash can significantly shorten the lifetime of the SSD. Consequently, SSDs can fail to meet the customer expectations and may require frequent replacement.

A number of principles are described below that allow for flash memory to be used effectively as non-volatile storage despite its finite number of erase/write cycles. The solid state drive (SSD) architectures described below address the limitations of NAND flash memory by creating DRAM logical flash to act as an intermediary between the flash memory and then independently assessing when data should be written to the NAND flash memory. This significantly improves the operational speed and lifetime of the SSD and allows the SDD to be used as a plug and play alternative to hard disk drives.

Data usage within a computing device typically falls into two categories: a high amount of usage during creation/manipulation of the data and then a far lower amount of usage when the data is archived or stored as a functioning program. The illustrative SSD separates the process of storing data related to the transient state of the computing device and the permanent storage capability of the flash.

When the computing device is powered down, the data stored by the volatile memory of the computing device is lost. The SSD described below facilitates the creation of data files by allowing the data to be stored during development of the program or data file and protecting against data loss when the computing device powers down.

The SSD includes several flash interface controllers managing an optimum number of flash memory devices. In a simple system like a USB2 device one intermediate controller can be used to manage the flash directly. However, in a high speed system several controllers can be operated in parallel to manage the data much more rapidly. Principles described below can also be applied to a wide variety of bus and device technologies, including SATA 3 (500 megabytes per second), USB 3.0 "Superspeed" devices, including USB 3.0 solid state drives and storage devices. The USB 3.0 specification specifies transfer rates of up to 4.8 gigabits per second, increased maximum bus power and more efficient power management.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with the example is included in at least that one example, but not necessarily in other examples.

In several instances below, a controller is described that includes at least one microprocessor, read only memory (ROM) and random access memory (RAM). The microprocessor, ROM and RAM work together to implement the functions of the controller. The use of a different microprocessor with different controls and/or hardware implementation can be used to implement the principles described herein.

FIG. 1 shows one implementation of a solid state drive that includes logical flash and nonvolatile flash memory. The logical flash includes an independent controller and a segment of volatile memory. The logical flash is configured to implement all the functions of a flash controller such that the central processing unit (CPU) thinks it is reading and writing to flash, when it is actually reading and writing to logical flash. The logical flash implements flash memory behavior, but without the lifetime, speed, or addressing limitations of flash memory. The logical flash stores files in the same way as the flash memory and responds to flash commands. Further, the logical flash uses the FAT or NTFS table, updates logical records, combines files, and is attached to a SATA 3 bus. Because the volatile memory of the logical flash has a virtually unlimited number of read/write cycles, the system processor and operating system can store as many updates and snap shots as desired. Further, the logical flash is extremely fast in both reading and writing data. The CPU reads from and writes exclusively to the logical flash while writes and reads to the flash memory are controlled exclusively by the solid state drive. The use of logical flash allows all flash commands to be handled at full interface speeds and minimizes writes to the flash memory. This is different from caching, because caching ultimately writes everything to flash memory and is implemented only to increase speed and to handle short read and writes.

A master controller within the SSD independently determines when data should be transferred to or from the flash memory. This significantly reduces the number of write/erase cycles for the flash memory because the CPU does not directly access the flash memory.

The flash memory includes a number of flash memory modules. Each flash memory module includes an independent controller and a number of flash die. By using independent controllers, the SSD can perform multiple operations in parallel. This leads to significantly faster read and write times.

The paragraphs below describe a variety of principles for developing an SSD that incorporates logical flash and multiple controllers. SSDs are currently more expensive per gigabyte of storage than hard disk drives. This is primarily due to the cost of the nonvolatile memory die that are used to store the data in the SSD. The memory die are typically flash memory, although other types of memory have been proposed, including Ferroelectric Random Access Memory (FeRAM), Magnetoresistive Random Access Memory (MRAM), Programmable Metallization Cell (PMC), Phase-Change Memory (PCM), and other technologies. Each of these types of nonvolatile memory types has advantages and disadvantages. However, flash memory is the most mature technology and has the lowest cost per unit of storage capacity. There are two predominant types of flash memory: NOR type and NAND type. Both NOR and NAND flash store data in memory cells made from floating gate transistors. These floating gate transistors have a finite number of program-erase cycles before wear begins to deteriorate the integrity of the storage. For example, NOR flash memory may have a typical endurance rating of 100,000 cycles and NAND flash memory may have a typical endurance ratings between 1,000 to 3000 cycles.

NOR type flash memory allows for a single byte to be written and/or read independently. However, this random access feature makes NOR memory less dense per unit area and more expensive per unit of storage. NAND type flash is very high density and has a correspondingly lower cost per unit of storage. However, in current chip architectures, NAND type flash must be read and programmed in larger segments called blocks. This limitation is significant because altering a single bit in a block requires the erasure and rewriting of the entire written space in a block. For purposes of explanation, NAND type flash will be used in illustrative examples of solid state drive architectures. However, the principles described herein can be applied to a wide variety of nonvolatile memory types.

As discussed above, NAND type flash is inexpensive and compact but has the disadvantages of having a finite number of program-erase cycles before wear begins to deteriorate the integrity of the storage. This challenge is compounded by fact that, while NAND type flash can be read at the bit level, NAND type flash must be written and erased in large segments ("blocks") rather than at the bit level. Consequently, when any bit in a block changes, the all the data in the block must be copied to a new block. During the copying process, the new bit(s) are incorporated into the data stored on the new block. The old block is then erased and used again. Programs and operating systems on many computing devices frequently read and write to the hard drive, which could lead to rapid degradation of the NAND flash. In these industry standard operations, changing even one bit in a block requires the copying and erasure of the entire block. In the discussion below, principles are described that provide from holding a block until it is full and only updating the pages that have already been written.

In some Apple® operating systems, the user's files are continuously written to the hard drive to allow the user to restore the machine to a previous state. Not only does the system recover to latest state, there is a program called a "time machine" that allows the system to be restored to any previous state for months before. This program compresses the snapshots and allows recovery to a day but not any period during that day. However, the snapshots can be maintained so that recovery to a particular point for the previous few days is possible. This time machine feature can be very useful in recovering files that were mishandled or lost. Recovering to time before the mistake was made allows for fully recovery of the file and system state.

These and other frequent write operations can lead to the early failure of flash memory because the limited amount of write/erase cycles can quickly be exceeded. Every new write requires a copy of the old data to a new block to add the new data. As discussed above, each memory location in the NAND memory can only be updated on the order of 1,000 to 3,000 times without substantially increasing the likelihood of failure. There are many algorithms that try to work around this problem, such as over-provisioning the memory with spares and wear leveling algorithms that attempt to spread the wear uniformly over the entire flash memory rather than concentrating it in the same blocks. However, these techniques may increase the cost and decrease the performance of solid state drives.

The examples below describe various solid state drive (SSD) architectures, methods and principles. These SSDs incorporate flash memory for nonvolatile storage and are designed to have an order of magnitude longer lifetime than conventional SSDs and operate at full bus speeds despite the limitations of the flash memory.

Illustrative Flash Memory Module

Figure 2:
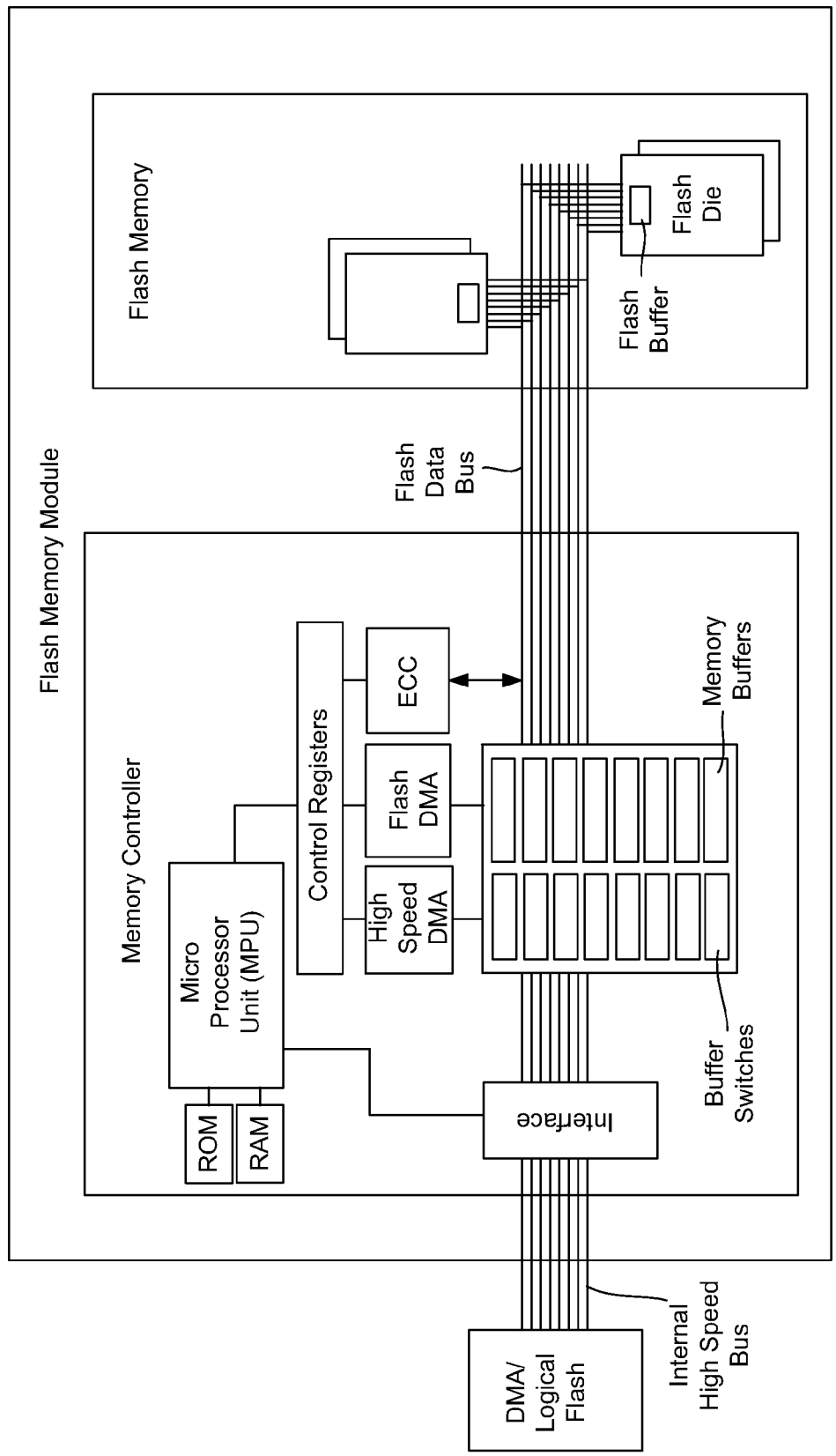
FIG. 2 is a block diagram of a flash memory module, according to one example of principles described herein.

FIG. 2 is a diagram of an illustrative flash memory module. As discussed above, flash memory is nonvolatile computer storage that can be electrically erased and reprogrammed. As discussed above, flash memory has a high resistance to mechanical shock, small foot print, relatively fast read times that are comparable to dynamic Random Access Memory (RAM), is energy efficient and can store data for years without power. Flash memory is used in a variety of applications, including personal computers, mobile devices, digital cameras, video games, scientific instrumentation, industrial robots, medical electronics and other devices. Flash memory has several limitations, including slow write times and limited lifetime. For flash memory, the write times are typically order of magnitude greater than the read times. The lifetime of various types of flash memory typically ranges from 1000 to 3000 erase cycles. The erasure of the flash memory causes incremental damage that eventually leads to failure of the memory mechanism in the flash memory.

The illustrative flash memory module shown in FIG. 2 includes a number of NAND flash die. The memory controller includes a processor, a small amount of Random Access Memory (RAM), a small amount of Read Only Memory (ROM), and a number of memory buffers. Examples of this memory controller are given U.S. Pat. App. No. 61/774,175; entitled "High Speed USB Controllers," to Charles I. Peddle, which is hereby incorporated by reference above in its entirety. For example, the memory controller may be based on a 6502 processor, with 20 kilobytes of processor addressable RAM, 40 kilobytes of ROM to store operating code, and eight memory buffers. The memory controller accepts data from an external bus, accumulates the data in the buffers, and writes the data to the NAND flash die. The external bus may be a USB bus or a high-speed internal bus.

The memory controller also includes a high speed Direct Memory Access (DMA) and a flash DMA. In general, a DMA protocol includes an address counter that automatically and progressively increments the memory addresses during data transfers. The DMA protocol also includes a counter that keeps track of the number of bytes transferred. To begin a DMA transfer, two commands are given, the memory location to start at and a count that tells the DMA how many bytes to transfer. The DMA independently transfers the data starting at the designated memory location until the count is exhausted. The purpose of the DMA protocol is to allow full speed transfers to and from a memory without the need for external inputs other than the memory clock and enables. This entirely eliminates the requirement for the microprocessor to directly be involved with data transfers. This enables higher transfer speeds because the data transfer is not limited by the microprocessor speed or interrupted when the MPU is redirected to a different task.

In this application there are two independent DMAs with different functionality. The high speed DMA ("bus DMA") controls the transfer of data from the high speed bus to a bank of memory buffers and the flash DMA transfers data to and from the flash. In one embodiment, data transfer from the high-speed bus to the memory buffers is the highest priority process and is interrupt driven. Data movement to or from the flash is done with polling because the process can be interrupted with little disturbance. Further, the polling generates positive control on the timing signals to the flash memory.

The use of two separate DMA modules (the high speed DMA module and the flash DMA module) provides several advantages. First, by including two separate DMA modules, data can be simultaneously written to and read from the memory buffers. Additionally, the separate DMA modules can operate differently and be controlled differently to facilitate data transfers. For example, the high speed DMA may be operating on a high speed clock and write data to one memory buffer while the flash DMA is reading data out of a different memory buffer at slower speeds. In contrast, the flash DMA may operate on a flash clock and be operated by polling. Additionally, the flash memory module generates, stores, and uses error correction code (ECC) to automatically recover data that has a limited number of errors due to write and/or storage failure. In addition to the data received on the high speed bus, the flash memory module also writes additional information to the flash memory including wear number, logical record number, update number, and other data. This process is described in greater detail below. The registers can run at various clock rates and be switched between various functions.

The structure and architecture given above is only one example of a flash memory device. A variety of other structures could be used. For example, larger memory buffers, larger sector sizes, more memory buffers, different numbers of memory buffers and different numbers flash die could be included in the architecture.

Illustrative Solid State Drive Architecture

Figure 3:
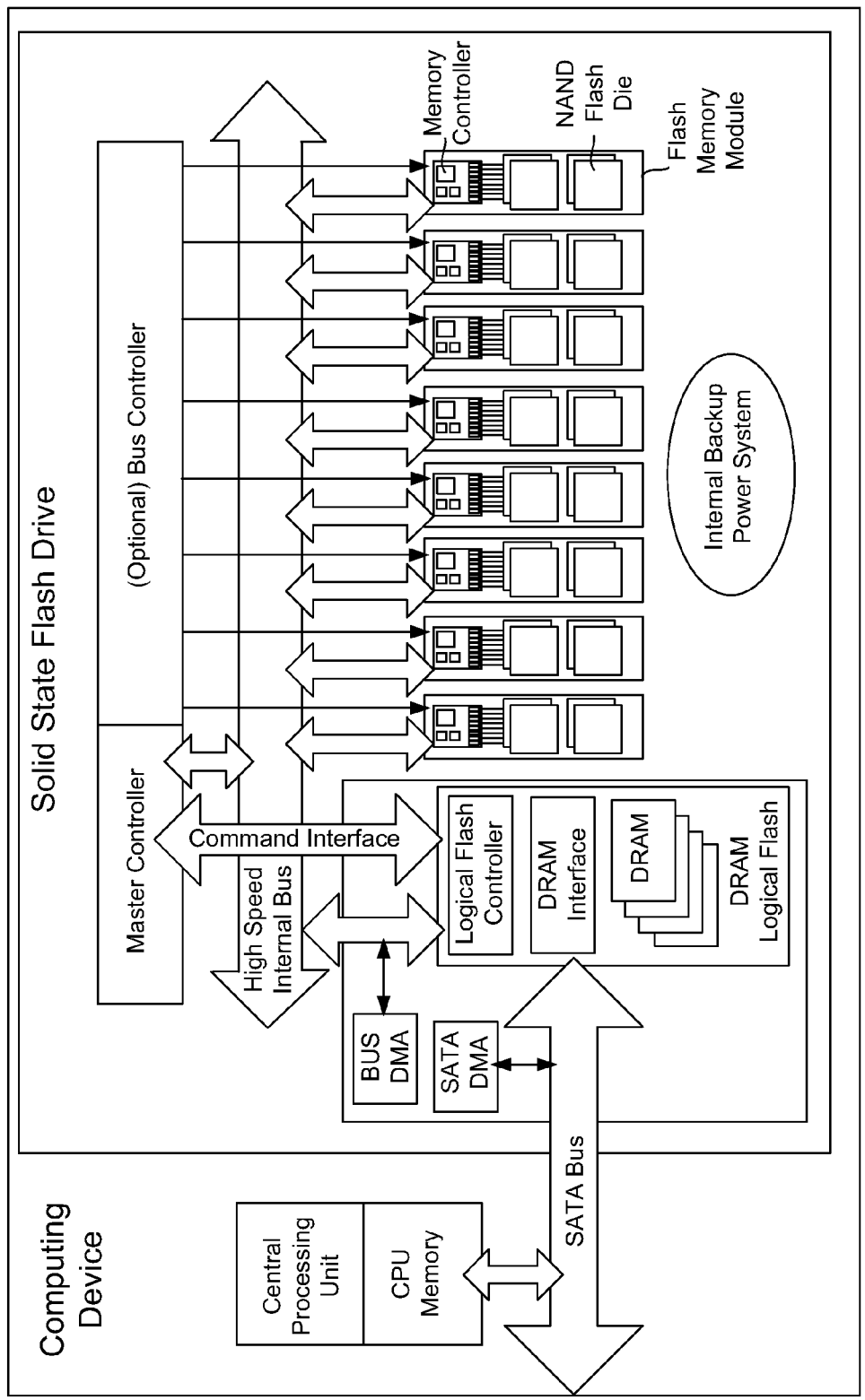
FIG. 3 is a block diagram of an illustrative solid state drive architecture that incorporates flash memory modules shown in FIG. 2, according to one example of principles described herein.

FIG. 3 shows an illustrative example of a SSD architecture that incorporates a number of flash memory modules such as those described above with respect to FIG. 2. The SSD architecture is capable of sustaining SATA data rates and mitigating the limited lifetime of the NAND flash memory. In this example, a central processing unit (CPU) external to the SSD is connected to a SATA bus. The SSD drive accepts data input, commands, and outputs data via the SATA bus. This output data is initially stored in DRAM logical flash. The DRAM logical flash includes a DRAM controller and a large bank of Dynamic Random Access Memory (DRAM). The DRAM logical flash is connected to a high speed internal bus. In addition to the connection to the DRAM logical flash, the high speed internal bus is connected to a bank of flash memory devices, and a master controller. In some embodiments, there may be a separate bus controller that controls operation of the high speed internal bus. Alternatively, the functionality of the master controller and bus controller can be combined so that the master controller performs the functions of the bus controller. The high speed internal bus allows bidirectional communication between any of these entities. The bus controller (or master controller acting as a bus controller) independently selects the device that is going to receive or transmit data. This allows the data flow to be controlled for each device individually (and in some examples sequentially). For example, the DRAM controller can accept data from the SATA bus while the bus controller is transferring data out of the DRAM and into the flash memory devices. These simultaneous operations allow for more efficient operation and higher overall throughput. Flash operations can have temporal variations so the final synchronization of the data is done by the master/bus controller managing the high speed bus and coordinating with the logical flash controller. This balancing approach allows SATA interface or other interface to run at full bus speed when reading or writing to the SSD.

Controllers

The SSD architecture uses a number of controllers to manage internal data flow. The master controller receives instructions from the central processing unit of the computing device and manages the operation of the solid state flash drive to perform the instructions. The master controller directs the operation of the bus, flash memory controllers in each of the flash memory devices, and logical flash controller. In one implementation, each of these controllers is a simple microprocessor system as described. According to one illustrative example, each of the controllers (master controller and optional Bus controller, DRAM controller, eight flash controllers) is a completely independent system with its own microprocessor, ROM for storing code, RAM, and bank of registers. For example, the controllers may be based a 6502 processor combined with 32 kilobytes of RAM and 24 kilobytes of ROM. The logical flash controller manages data transfer into and out of the DRAM by controlling DMA transfers and interfacing with the logical flash controller. The logical flash controller manages the DRAM logical flash under the direction of the master controller. The master controller manages the transfer of data between the DRAM and flash memory. The individual flash controllers deal with the page mode structure for the flash memory, error correction, and wear leveling. The memory controller in each of the flash memory devices manages transfer of data between the high speed internal bus and the NAND flash die.

The use of multiple internal controllers provides a number of benefits. The controllers can perform dedicated functions that are specifically adapted to the device they are controlling while flexibly coordinating with other controllers. For example, the memory controllers may interface with the high speed bus at a first clock speed and then manage data being written to the NAND flash die at a different clock speed. Additionally, the memory controllers may signal the master controller when they have completed a task. This allows the master controller to intelligently allocate resources to maximize data transfer rates.

Direct Memory Access Interfaces

Direct Memory Access (DMA) interfaces manage the transfer of data for each controller that is connected to a bus. As discussed above, DMA is a hardware implemented protocol that allows hardware subsystems within the computer to access system memory independently of a controller. The controller can initiate a transfer, do other work while the transfer is in progress, and receive a feedback from a DMA controller once the transfer is complete. For example, a SATA DMA handles transfer of data from the SATA bus to the DRAM Logical Flash. A bus DMA handles transfer of data between the DRAM Logical Flash and the high speed internal bus. Similarly, DMA interfaces between the high speed internal bus and each of the flash memory devices manage data transfer into and out of the flash memory devices.

Using DMA techniques maintains the speed for both writing the flash and transferring data to/from the interface. As discussed above, a DMA protocol includes an address counter that automatically and progressively increments the memory addresses during data transfers. The purpose of the DMA protocol is to allow full speed transfers across an interface without external inputs other than the memory clock and enables. This entirely eliminates the requirement for a microprocessor to be directly involved with data transfers and enables higher transfer speeds because the data transfer is not limited by the controlling processor or interrupted when the controlling processor is redirected to a different task.

To begin a DMA transfer, the controlling processor may load control registers with addresses, a count for the number of DMA operations and other enabling functions. The data transfer then occurs as a function of the parameters in the control registers. The DMA may be configured such that other data may be added during the transfer such as error correction data, logical records, and housekeeping functions. The DMA protocol can trigger a variety of responses to signal the controlling processor that a data transfer is complete or to provide a status update. This allows the data to be accessed as soon as the DMA transfer is complete. Additionally, the use of interrupts to signal the status of data transfers allows for polling style parallel distribution of data between multiple memory storage components within the SSD.

DRAM Logical Flash

The DRAM in the DRAM logical flash uses arrays of capacitors to store data. The capacitor may be either charged or discharged. These two states represent the two values of a bit. Since the capacitors leak charge, the state of the capacitor eventually fades unless the capacitor charge is refreshed periodically. This refreshing occurs over intervals on the order of 10 to 100 milliseconds. DRAM is very simple, has negligible read/write cycle wear, and can be very densely packed onto a die. Additionally, DRAM provides extremely fast write and read times (on the order of 10 to 100 nanoseconds). The operation of the DRAM is controlled by a DRAM controller. In this example, the DRAM has a total capacity of 8 Gigabytes of Double Data Rate type three Synchronous Dynamic Random Access Memory (DDR3 SDRAM). In other implementations, the DRAM may have larger (e.g. 16 GB Gigabytes) or smaller amount of memory.

For power management, the DRAM can operate at a clock speed of 800 Megahertz. However, any suitable clock speed and amount of DRAM can be included in the design. The DRAM logical flash stores files in the same way as flash and responds to flash commands. Further, the DRAM logical flash uses a file allocation table, updates logical records, combines files, and is attached to a SATA bus.

DRAM logical flash is not cache for a number of reasons. For example, cache is an alternative location for the CPU to look for data. If the data isn't in the cache, the CPU accesses the underlying nonvolatile memory. In contrast, the DRAM logical flash is the only memory in the SSD that is directly accessible to CPU. The actual NAND flash is under control of a master controller and is not directly accessible to the CPU. The DRAM logical flash acts as a gatekeeper between the CPU and the NAND flash. By separating the NAND flash from the CPU instructions, the NAND flash is not subject to numerous peculiarities of the operating system, including frequent writes. This allows the operating system to run without modification while protecting the lifetime of the NAND flash.

Data and files are only stored to the DRAM logical flash until deleted or no activity is observed. In general, data in the DRAM logical flash is organized by logical record for the user control of the data and referenced by the FAT table to control the operations of the various data records. However, in some instances, the DRAM logical flash may receive, store, and transfer data without the use of logical records. For example, the Snapshot and FastLoad procedures described below do not use logical records. However, all the data transfer modes the movement of data out of the DRAM logical flash to the flash memory is governed only by the master controller. The master controller may make decisions about when the data or files are moved out of the DRAM logical flash based on a number of factors, including the lack of use of the file. CPU commands received by the master controller may have some influence on the master controller moving data into/out of the flash, but it is the master controller that makes actually makes the decision about retrieving data from or writing data. For example, if the CPU requests a data file the master controller determines if the file is in the DRAM logical flash. If the requested data isn't in the DRAM logical flash, the master controller retrieves it from the flash and stores it in the DRAM logical flash.

In some instances, files and/or data may only be stored on the DRAM logical flash and never transferred to the flash memory. For example, a temporary data file may be created for a transient operation (such as a search). In other examples, a file may be created for a letter or email that will be sent to another system or stored by a remote system. When the file is sent to the remote system, the file can be deleted.

Cache appears to the CPU to have exactly the amount of physical memory that is actually present in the cache. In contrast, the DRAM logical flash appears to have a capacity that is much greater than the physical capacity of the memory that makes up the DRAM logical flash. The DRAM logical flash appears to have a capacity that is equivalent to the total working nonvolatile memory of the NAND flash.

Cache appears to the CPU to be volatile memory. In contrast, DRAM logical flash appears to be extremely fast nonvolatile memory. When a CPU writes data to cache, the CPU doesn't assume that the data is actually in nonvolatile storage. The CPU continues to manage the data flow until the data is actually stored in the nonvolatile storage that follows the cache. When power is unexpectedly lost to the cache, the data in the cache is lost and the CPU must recover without it. All cache transactions either fail or are written to nonvolatile flash memory increasing the wear and delaying the system.

In contrast, the CPU and operating system assume that the DRAM logical flash is the nonvolatile memory storage. The DRAM logical flash reports that data written to it is stored on the nonvolatile flash memory even through it actually stored in the DRAM logical flash. When the power to the SSD is lost, the CPU correctly assumes the data stored in the DRAM logical flash is stored in nonvolatile memory. This is correct because the SSD has a self-contained and self-powered system for dumping the data in the DRAM logical flash to NAND flash. In one implementation, the NAND flash is configured with an extra provision of spares to accommodate a data dump of all the data that can be stored in the DRAM logical flash.

Cache is designed to minimize access time to data stored in a slower memory. In typical cache operations, the cache writes data as quickly as possible to the nonvolatile storage but continues to hold the data written to minimize access times. In contrast, the DRAM logical flash is designed to minimize writes to the underlying memory. The master controller in the SSD only targets data that is not being used for transfer from the DRAM logical flash to the flash memory.

High Speed Internal Bus

As discussed above, the high speed internal bus allows bidirectional communication between any of these components connected with it. In one example, the master controller individually directs data to the memory controllers over the high speed internal bus. To implement the write transfer to the flash, the logical flash controller/interface connects the DRAM logical flash to the high speed internal bus and uses DRAM DMA to make the transfer to a designated file location. Using this technique, data could be directly transferred from the CPU, through the DRAM logical flash, to the flash memory. For example, high speed internal bus may be 8 bits wide and capable of operating at speeds of at least 400 megabytes (MB) per second. Data transfer rates over an 8 bit bus operating at 400 megahertz (or higher) would be approximately 400 megabytes per sec.

Flash Memory Devices

As discussed above with respect to FIG. 2, each of the flash memory devices includes a memory controller and a number of NAND flash die that make up the flash memory. The flash memory is divided into sectors, pages, blocks and planes. In this example, a sector is approximately 512 bytes with additional room for header and error correction code (ECC) information. In other implementations, the sector may be larger. A page is a group of sectors, a block is group of pages, and a plane is a collection of pages. In one example, a page includes 8192 bytes for data and additional room for header information. A block may be a group of 256 pages and a plane is a group of 2096 blocks. A device may include any number of planes. For example, a 32 gigabyte device may include 2 planes or 8,192 blocks. A 256 gigabyte device may include 16 planes or 65,536 blocks. Typically when a non-recoverable or repairable flash data error occurs in a sector, the entire block is marked as bad. However, using a page mode controller, only the offending page is marked as bad and is mapped around. This is further described in U.S. Pat. No. 8,122,319 to Charles I. Peddle, which is hereby incorporated by reference in its entirety.

As discussed above, an entire block of flash memory is traditionally considered unusable when a single bit in one of the pages in the block is inoperable. Consequently, a defective bit may reduce the storage capacity of the flash memory by 128 KB or more. When multiple defective bits are dispersed among many blocks, a flash memory may fail to meet capacity standards and may be discarded. However, many completely functional pages remain within each failed block. As shown below, by identifying inoperable pages rather than inoperable blocks, much of the storage capacity of the flash memory may be reclaimed.

Various commands are used to access a flash memory. For example, read and write commands to a flash memory may operate on a single page. Erase commands, however, affect an entire block. With the exception of block erase operations, nearly all operations may be performed on a single page. Once the pages in a block are erased, they may be selectively written in a manner that avoids inoperable pages.

Although the flash memory itself may not include logic to select only operable pages within a block, a memory controller may be configured to identify, select, and operate on only the operable pages. The memory controller may be implemented as a semiconductor chip separate and distinct from the flash memory. The memory controller coordinates the transfer of data to and from the flash memory. The memory controller processes requests from external devices by sending appropriate commands and memory addresses to one or more flash devices. According to one embodiment, the memory controller may generate chip select, block select, row select, and column select signals to transmit to one or more flash memories. The memory controller may also monitor control signals, status signals, timing constraints, and other aspects of data transfers to and from a flash memory device.

The memory controller may translate a virtual memory address (such as a logical record) from an external system to a physical address on one or more flash memory devices. A memory controller may receive a query from a processor requesting certain data. In response, the memory controller may determine the corresponding block, page, and byte where the requested data is physically stored in one or more flash memory devices. The memory controller may then issue the correct sequence of control signals and memory address values to the flash memory device to retrieve the requested data.

Similarly, the memory controller may translate write requests into an appropriate sequence of block erase, address select, and write commands to store data on a flash memory device. In effect, the memory controller may allow various systems and components access to the storage of the flash memory devices while concealing the complexity of the page mode interface with the flash memory devices. For example, when previously written data in a flash memory device is updated, the old data as well as the new data is written to a new block and the old block is erased. The memory controller may generate and execute the correct sequence of operations to carry out the storage operation. The memory controller may also identify which blocks contain a sufficient number of operable pages to complete an operation. Where data is transferred from a source block to a destination block, the destination block is selected to contain at least the same amount of storage capacity as the source block, but the destination block may still include one or more inoperable pages or sectors.

To track the number of operable pages in within each block, the memory controller may build a "good page" table, a "bad block" table, a table that has a "good" or "bad" designation for each page of the memory, or other indicator. The "bad block" table may identify inoperable pages and thus identify operable pages indirectly. The memory controller or other element may then be configured to read and write to any page except those listed as inoperable. An indication of operable pages may include one or more references, pointers, addresses, tables, lists, sets, identifiers, labels, signs, tokens, codes, or equations, or other information that may allow an operable page to be identified.

In one embodiment, a table of operable pages may be stored in the designated block or blocks of the flash memory. For example, thorough testing of an entire flash memory device by a memory controller may occur when an indication is incomplete, unreadable, missing, or damaged. This type of testing may occur when the memory controller and/or flash memory devices are powered on for the first time. Additional tests, for example by an error correction code (ECC) module may be performed during operation of a flash memory device to detect pages that fail during use. Error detection methods used during flash memory operation may include, but are not limited to, generating checksums, comparing checksums, performing redundancy checks, generating parity values, performing parity checks, and executing other error detection algorithms. If a failure is detected in a page, the ECC module may alert the flash controller that a failure occurred or that an operation in progress was unsuccessful. The flash controller may then repeat the operation in a new page or otherwise correct the error. If a page has recoverable repeatable errors then that page is discarded. The master controller than takes appropriate action to exclude these pages by their designation in the table. From this point on the defective page is not used.

When one or more indications are updated, internal operations and data transfers may be completed to hide failures and reconfigurations from systems accessing the flash memory devices and ultimately from a human user of the flash memory devices. Consequently, a failure will not disturb the overall experience of a user and will not require compensation by outside systems. According to one embodiment, this may be accomplished with spare blocks, pages, and/or sectors that may be reserved during an initialization, testing, or other phase. As failures occur, data and addresses for failing blocks, pages, and/or sectors may be replaced by spare blocks, pages, and/or sectors. One or more indications may then be updated to reflect the new logical memory addresses and physical memory addresses for the data.

In summary, page based failure management in a flash memory controller allows a memory controller to access a "good page" table or other indicator of the functionality of each of the pages within flash memory blocks. The memory controller can then execute read, write and erase commands utilizing the operable pages in each block, even if the block contains one or more inoperable pages. The use of page mode allows for a significant extension of the life of the flash memory. Further, the use of page mode allows for more efficient use of flash memory that has lower lifetime ratings and/or a higher number of errors. Rather than discard these flash memory chips with errors, these chips can be effectively used and have an extended lifetime in a device that implements page mode failure management as described above.

The memory controller accepts data from the high speed internal bus using DMA protocols, accumulates the data in its internal buffers and writes the data to the NAND flash die. Each flash memory module is configured to provide data transfer speeds of approximately 40 megabytes per second to and from the flash die. These parallel flash memory modules may have a number of configurations, including those described in U.S. Pat. App. No. 61/774,175; entitled "High Speed USB Controllers," to Charles Peddle, which is hereby incorporated by reference in its entirety. For example, there may be parallel eight flash memory modules. In one implementation each of the flash drives includes four flash dies. Each flash die includes 8 Gigabytes of storage, resulting in a total flash storage of 256 Gigabytes. These drives are configured to operate in parallel, providing approximate transfer rates of 320 Megabytes per second for data writing. Reading data from flash memory is significantly faster than writing data to the flash memory. Consequently, the flash memory modules may exhibit correspondingly higher data transfer rates during reading operations.

Moving Data Between the CPU Memory, DRAM Logical Flash, and Flash Memory

Figure 4:
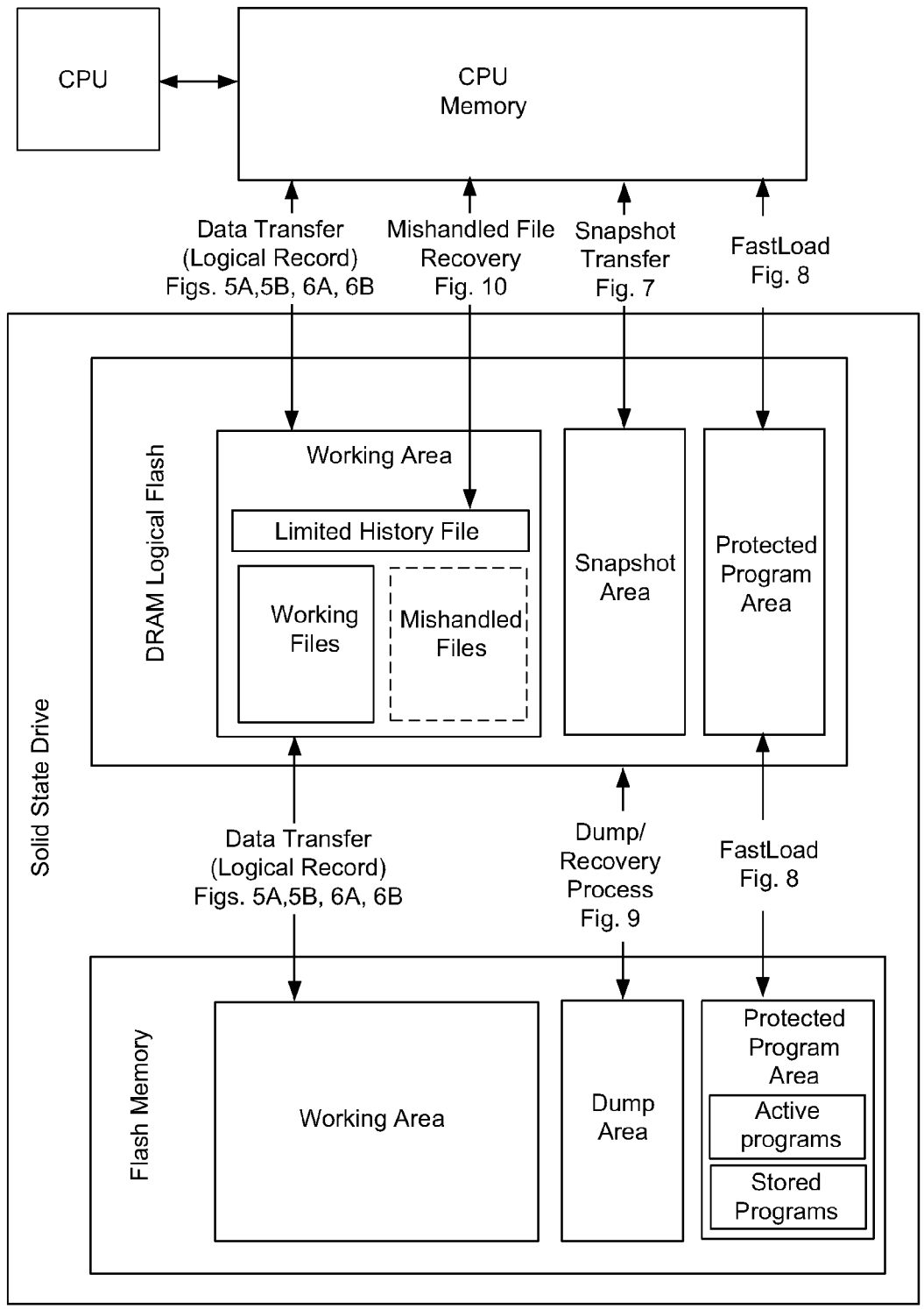
FIG. 4 is a diagram various interactions and processes that occur between the CPU/CPU memory, DRAM logical flash, and flash memory, according to one example of principles described herein.

FIG. 4 is a diagram that shows an overview of various methods used to transfer data between the CPU memory, DRAM logical flash, and flash memory. Each of the methods for transferring data is described in more detail in the figures and description below.

The system shown in FIG. 4 includes a CPU that is operably connected to a CPU memory. As shown in FIG. 3, the CPU and CPU memory are connected to the DRAM logical flash in the solid state drive by the system bus (SATA bus). The DRAM logical flash is connected to the flash memory by a high speed internal bus. As discussed above, the movement of data between the DRAM logical flash and the flash memory is independently managed by the master controller. The master controller may act in response to commands received from the CPU, but CPU has no direct control over transfers to the flash memory and is unaware that these transfers occur.

The system can implement a variety of data transfers between memories to accomplish specific objectives. In general, the computing device sends commands about data collections called files. The commands are quite simple: read this file, write the file, or update an existing file. The command comes to the SSD as SATA commands which are interpreted by the master controller. The data from the external bus is streamed into the logical flash at full speed and the logical flash controller is directed to store or replace previous versions of the associated data file. The external bus may be a SATA bus, USB bus, or any other appropriate protocol or technology. When the computing device wants to read back a file or part of a file, the read command is initially given to the logical controller which is directed to retrieve the desired data from data stored in its memory. If the data is not in the DRAM logical flash, it is stored there under direction of the master controller from the flash devices and then transferred at high speed to the computing device. This data is maintained in the DRAM logical flash because it is likely to be updated and reloaded.

One approach described in PCT/US14/20406, entitled "High Speed Flash Controllers," which is incorporated herein in its entirety by reference, is to fix write errors in the individual flash controllers by rewriting data from the DRAM to the pages which are found to have a write error. The block value is then downgraded to eliminate the page found to have the error from further use. After a write operation is completed, under the principles disclosed herein, the master controller causes the written data to be compared with the corresponding data in the DRAM. Any data that does not match is rewritten in the SSD using the same technique described above for write errors generally.

FIG. 4 shows illustrative examples of five different data transfer techniques. A first technique is data transfer using logical records which is described in greater detail in FIGS. 5A, 5B, 6A, and 6B. The processor deals with logical records while the controllers deal with physical records. A translation table is used to convert/index the relationship between logical records and physical records. The translation table used for the SSD differs from the translation tables used in hard disk storage systems. This data transfer technique uses logical records to index and store data from the CPU memory to the working area of the DRAM logical flash as directed by the CPU and to subsequently store data files that are not being used to the working area of the flash memory under direction of the master controller. The master controller also directs retrieval of the data out of the working area in the flash memory into the working area of the DRAM logical flash for direct retrieval by the CPU memory.

A second data transfer technique is snapshot flow that allows for snapshots of the system state to be saved periodically so that the system can be recovered to a previous state. This technique is described in greater detail in FIG. 7. In this implementation, the data is transferred to a specified snapshot area within the DRAM logical flash without the use of logical records. Other techniques, such as tables, can be used to index and recover the snapshot data. In one example, the snapshots are indexed by time. The most recent snapshots are most valuable in recovering the state of the computing device. The older snapshots are overwritten by new snapshots during the use of the system. This stores the most recent snapshots for use in future recovery operations. The snapshots are stored DRAM logical flash and are not transferred into the flash memory until power down. On power down, only selected numbers of the snapshots are stored to the flash memory as part of the dump process. This can significantly increase the lifetime of the flash memory by reducing the number of writes made to the flash memory. In contrast, Apple notebooks store the snapshots directly to flash memory. This snapshot operation occurs frequently during use of the notebooks and results in significant flash wear.

Figure 8:
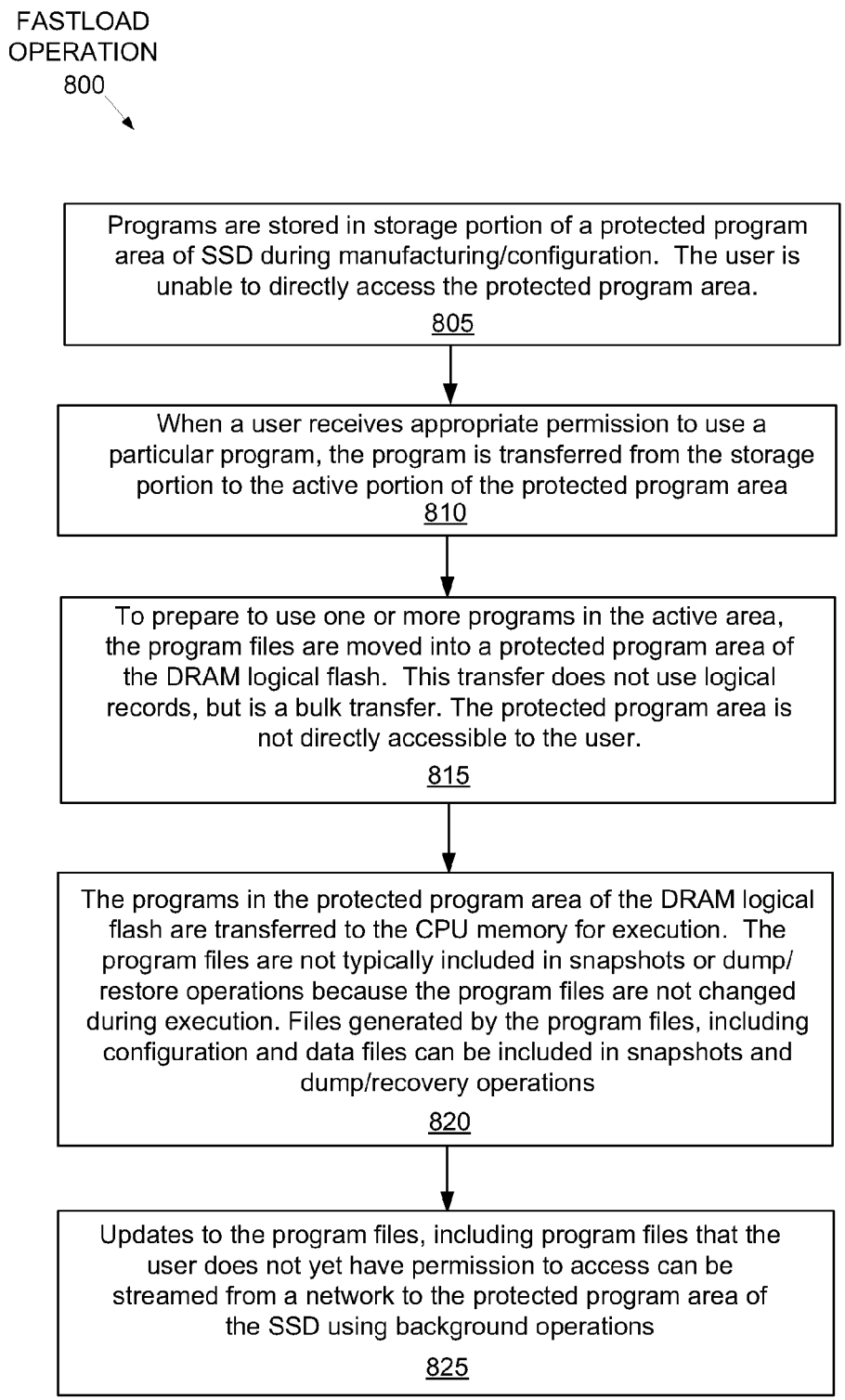
FIG. 8 is a flow chart of an illustrative method for fast loading program files from the SSD to the CPU memory, according to one example of principles described herein.

A third data transfer/storage technique is the FastLoad process described in FIG. 8. The FastLoad process includes a protected program area in the flash memory that stores program files. In this example, the protected program area in the flash memory has two divisions, one for stored programs and one for active programs. The FastLoad process is implemented by additional circuitry and logic that are not part of a standard controller using DRAM flash. When the user obtains permission to access the stored programs, the FastLoad process can be used to move the program files to a protected program area in the DRAM logical flash. From there, the CPU can request the program files to be transferred to the CPU memory for execution.

Figure 9:
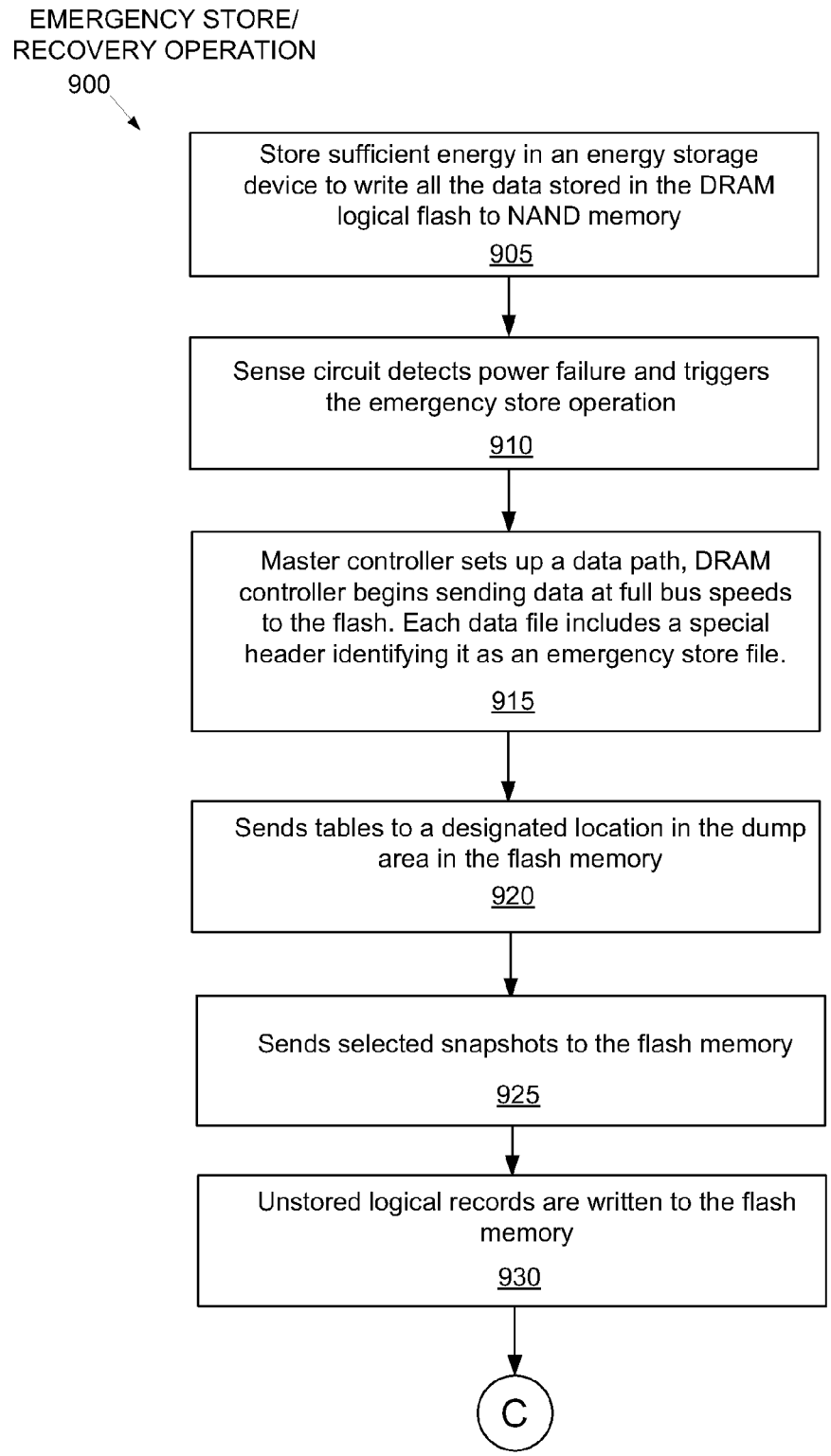
FIG. 9 is a flow chart of a method for data dump/recovery, according to one example of principles described herein.
Figure 9:
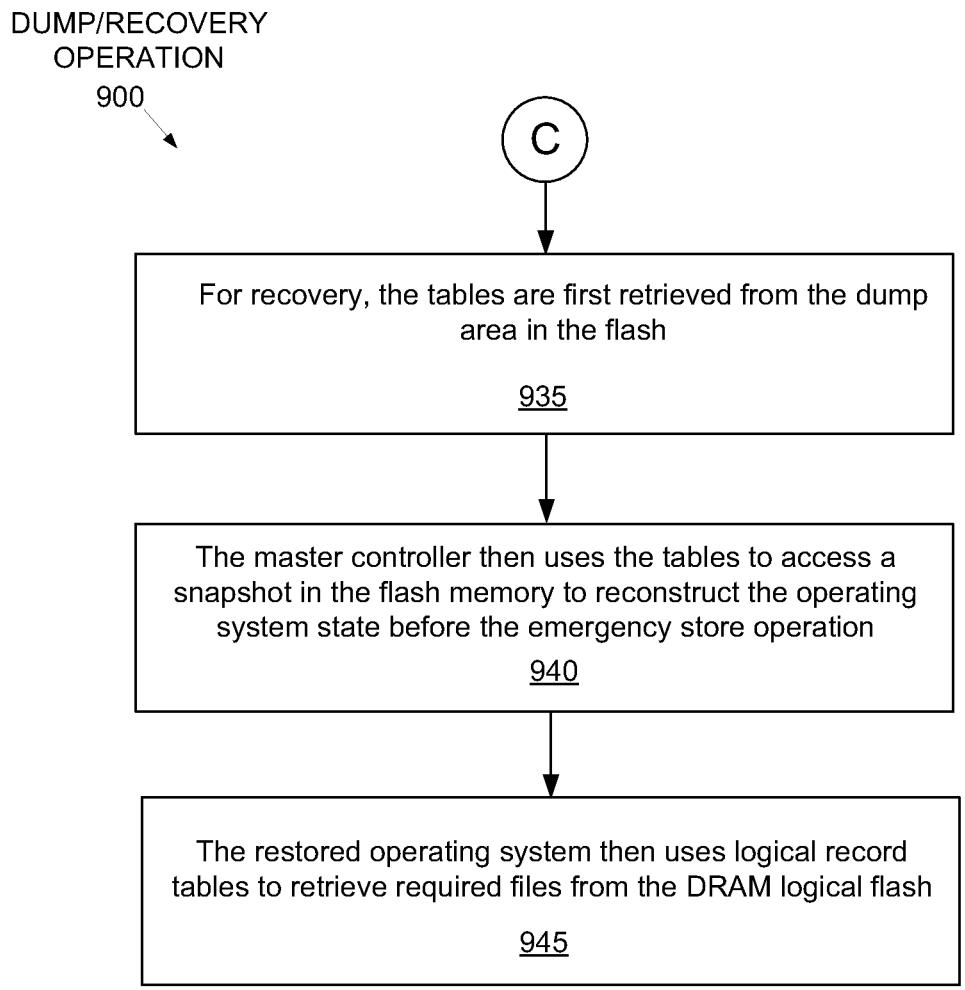

A fourth data transfer/storage technique is a dump/recovery process described in more detail in FIG. 9. The dump/recovery process occurs on power down or power loss. The dump/recovery process moves data out of the DRAM logical flash into a specified dump area in the flash memory. To recover, power is restored to the computing device and the data in the dump area is transferred back into DRAM logical flash and then to the CPU memory.

Figure 10:
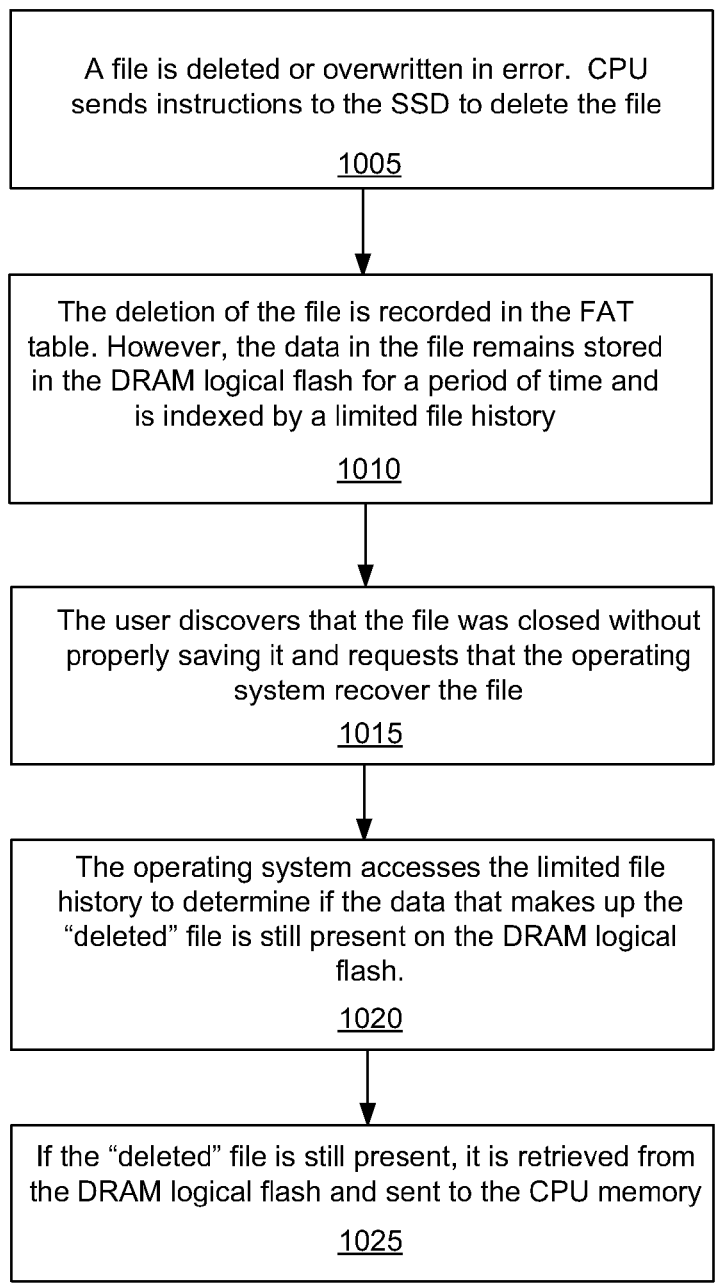
FIG. 10 is a flow chart of a method for mishandled file recovery, according to one example of principles described herein.

A fifth data transfer technique is a mishandled file recovery technique described in FIG. 10. A "mishandled" refers to any instance where an unintended and undesired change is made to a file. For example, all or a portion of a file may be deleted, or a desired file may be overwritten by another file. The mishandled file recovery technique provides for recovery of a file that the CPU has instructed to be deleted from the DRAM logical flash to be recovered from the DRAM logical flash. The DRAM logical flash has a latency period during which the mishandled files can remain stored in the DRAM logical flash. A limited history file is used to index and recover these mishandled files that still reside on the DRAM logical flash. Each of these techniques is described below.

Although the DRAM logical flash is illustrated as an integral physical part of the SSD, in some implementations, the DRAM logical flash may be constructed in the CPU volatile memory, with the CPU providing the control of reading, writing, and flash operations of the DRAM logical flash. However, in conventional CPU/CPU memory systems, there is no mechanism to maintain the power while dumping the data to the volatile CPU memory when the power goes down. To successfully implement the principles discussed herein, the computing device could have an independent power source to allow the data stored in the CPU memory to be dumped from the DRAM logical flash to the flash in the solid state drive.

Additionally, the DRAM logical flash may be used or configured to perform only part of the functions described above. For example, the DRAM logical flash may be configured to provide FastLoad operations or Snapshot operations without being used for logical record type data transfers. This may significantly simplify the operation of the DRAM logical flash. In other implementations, the DRAM logical flash may be segmented into operationally specific parts. The volatile memory associated with the microcontroller may be mapped into a snapshot/fastload segment (areas) and logical record segments (areas). The snapshot/fastload segment may store data that is transferred to the flash using special protocols and may or may not be indexed by logical records. In some circumstances the amount of DRAM logical flash may be increased to accommodate this mapping into separate segments/areas.

For example, the non-logical record area may store snapshot data or fastload data. The data in the non-logical record area may or may not be loaded into the flash. For example, if the non-logical record area of the memory contains 4 snapshots that can be used to recover the state of the computing device, only one or two of the most recent snapshots may actually be saved to the flash on power down. The other older snapshots are simply discarded.

In another example, fastload programs may be loaded into the non-logical record area of the volatile memory. These fastload programs are executables that are typically modified during normal operation and are not written back to the flash memory. There is an alternative logical path for updating the programs. This alternative logical path allows software programmers to update the software. Restrictions and protocols may restrict anyone other than the software distributors from accessing the authorized software programmers from accessing this area. This is because there are specific commands for these areas that are not disclosed to any unauthorized individuals or entities.

In order to protect copying of software, the operating system may not allow the copying of code loaded to the fastload to user ports or any other port in the system. Fastload is, in general, a read only function for the users. This prevents modification and distribution of the programs by the users. As discussed above, there may be separate commands in the protocol that are available only to the software publishers (or other authorized users) so that only they can update the software.

In other examples, there may be multiple separate memory controllers. In one implementation there may be one controller for the standard volatile memory included in the memory device and one for the DRAM logical flash. Further, the standard volatile memory may be protected and not directly addressable or accessible to the user and or computing device. In some instances, the standard volatile may have special restrictions or usage. In some embodiments, the memory may appear to be an extension of the system volatile memory.

Writing Files to the Solid State Drive

During ordinary operation the CPU uses the same protocols to write files to the SSD that it would use to write data to a typical hard drive. For example, the CPU may use the technique of writing and reading to the SSD using logical records. The internal operations of the SSD drive are independent from the CPU operations and are hidden from the CPU. As discussed above, the SSD drive accepts the data from CPU, but internally manages and stores the data in a unique manner that overcomes speed and lifetime limitations of the NAND flash memory. However, the SSD drive controls the interface between the SSD drive and the CPU so that it fully appears to the CPU that it is writing to hard drive or ordinary flash drive. Consequently, the SSD is a plug and play memory storage device that can be used in any of a variety of computing devices and transparently provides superior data transfer rates, long lifetime, and low power consumption.

Figure 5A:
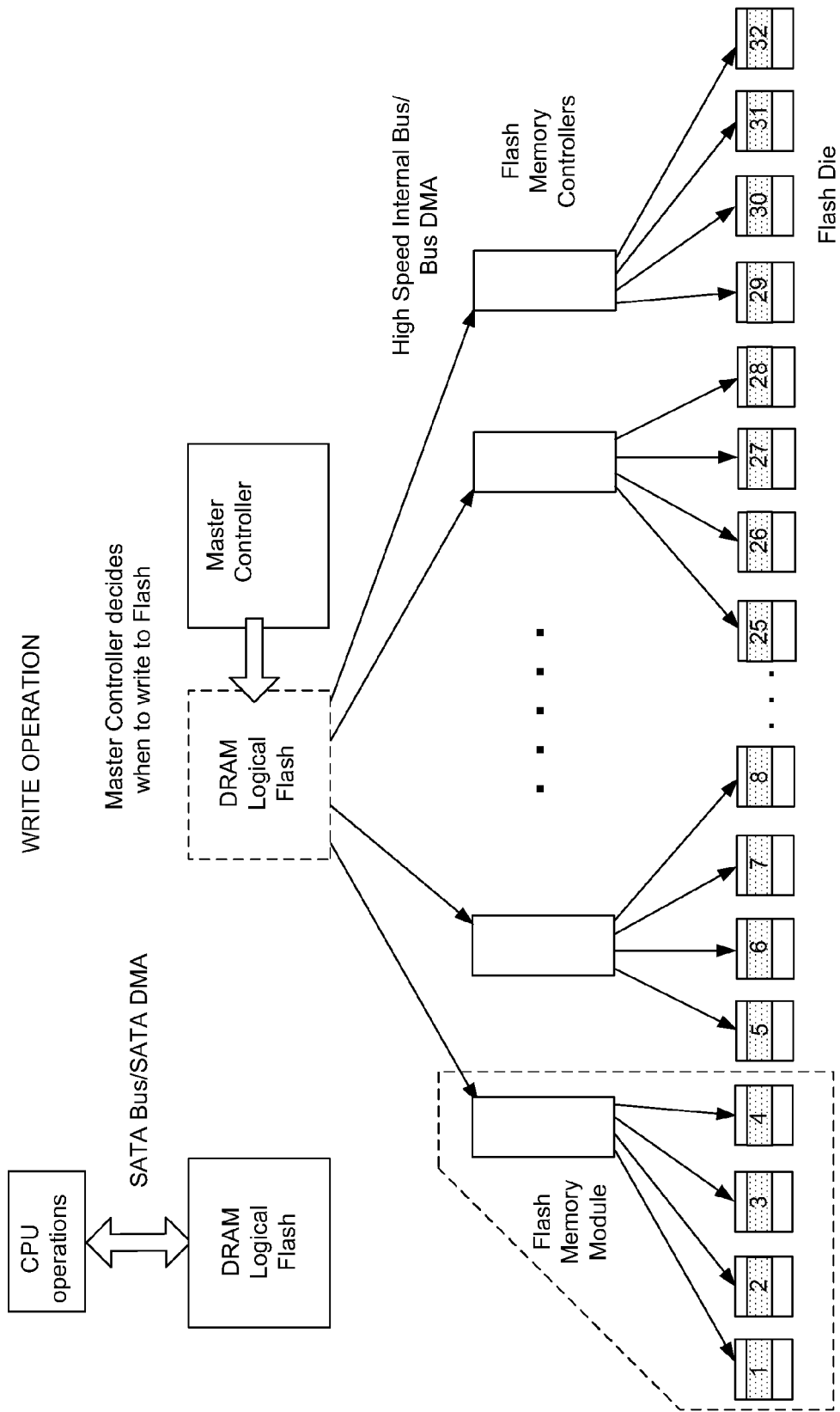
FIG. 5A shows data flow during writing of data to the solid state drive, according to one example of principles described herein.

FIG. 5A is a diagram that shows illustrative data flow through the SSD architecture that allows for extremely fast data transfer rates. Data is initially transferred by CPU operations over the system bus. For example, the system bus may be a SATA bus. The data is transferred off the system bus using a DMA process to the DRAM logical flash. As discussed above, the DRAM logical flash stores the data for later retrieval by the CPU. The CPU is only aware of the DRAM logical flash, which appears to be extremely fast non-volatile solid state memory with a memory capacity of the flash memory.

Figure 6A:
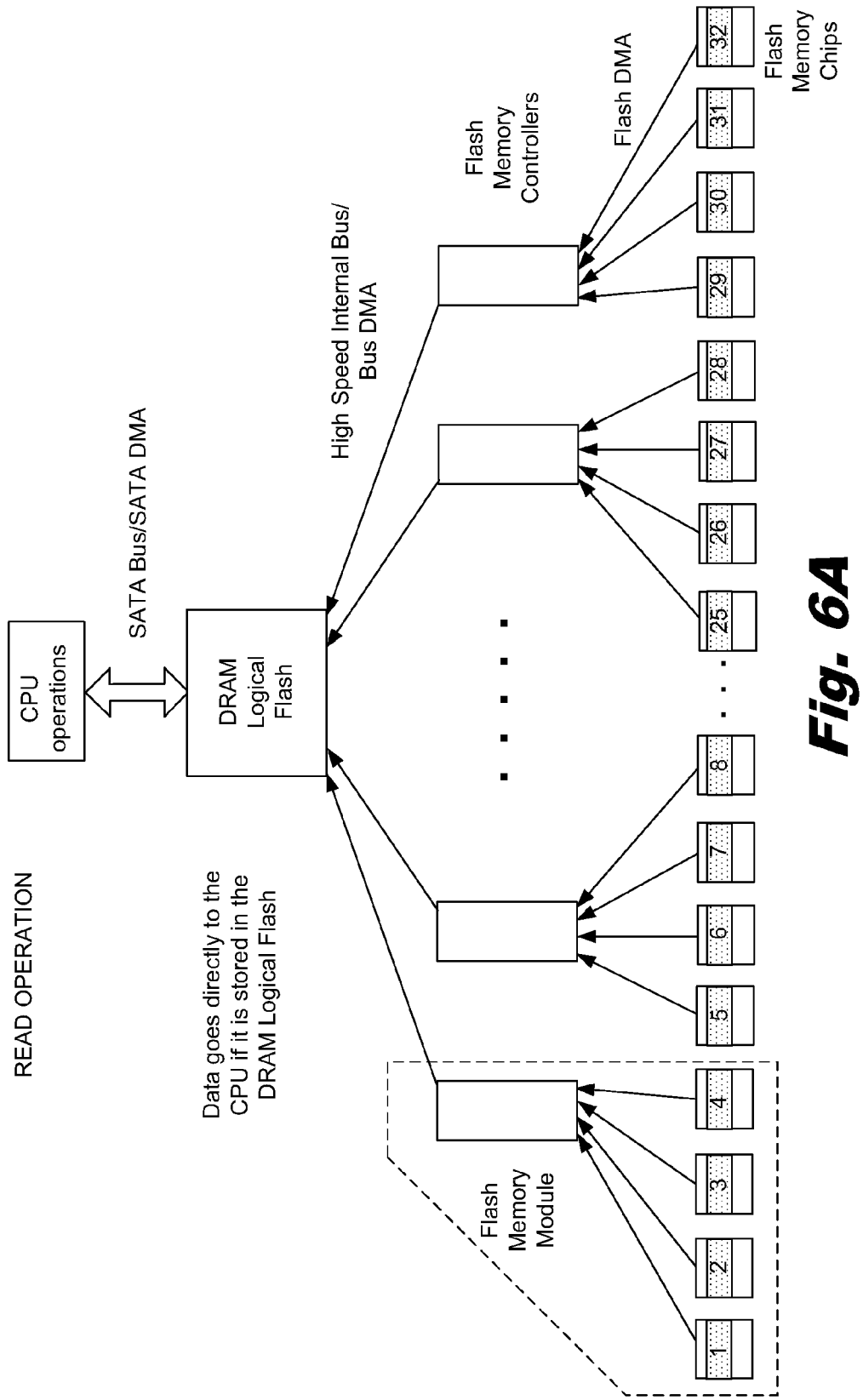
FIG. 6A shows data flow during reading data from the solid state drive to CPU memory, according to one example of principles described herein.

If the master controller determines that it is appropriate, the master controller decides to write data out of the DRAM logical flash to the flash memory. There may be any number of flash memory modules within the SSD. For example, the SSD architecture may include eight flash memory modules. For purposes of illustration, FIG. 5A shows only four of those devices. As discussed above with reference to FIG. 3, each of the flash memory devices includes a memory controller with buffers and a number of flash memory die. For example, each flash memory controller may control distribution to four, eight, or sixteen separate die. The distribution of data among a number of flash memory controllers provides a number of benefits including simultaneous writing to multiple flash die. This compensates for the relative slow write times that are inherent in the current implementation of flash memory. The independence of the master controller and various flash memory controllers allows for parallel data transfer with minimal latency. To enable parallel writes and parallel reading operations, a file is striped across the various flash memory die. In FIG. 5A this is illustrated as numbered boxes in each of the flash memory die. When a file is written the master controller sequentially address the individual flash memory controllers, which in turn sequentially address the flash die they control. This results in the file being distributed across the die and various portions of the file being written in simultaneously to different flash die. When the file is retrieved from the flash die, it can be read from the die in parallel. This is shown in FIG. 6A.

Figure 5B:
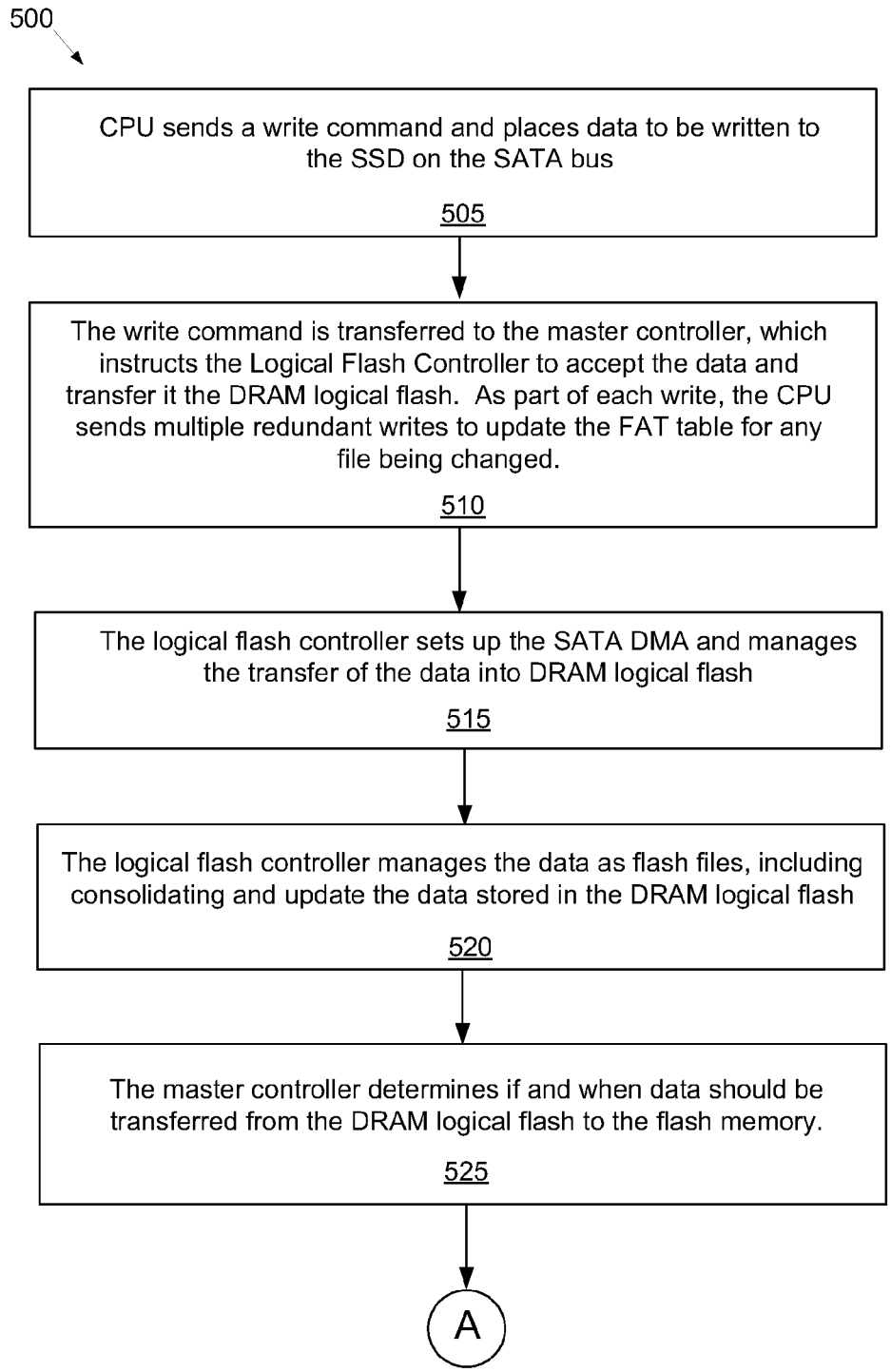
FIG. 5B is a flow chart describing a method for writing data to the solid state drive, according to one example of principles described herein.
Figure 5B:
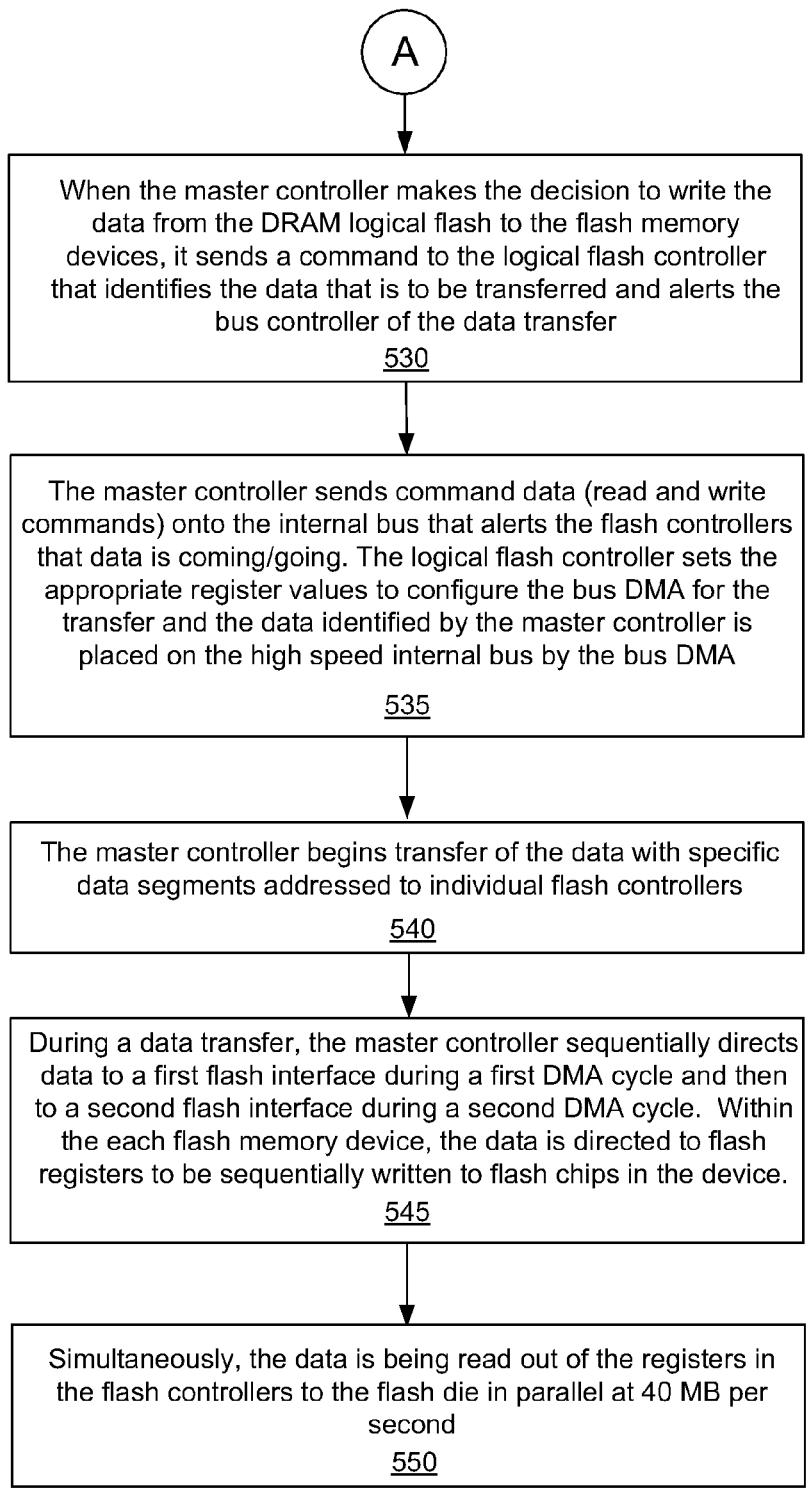

An illustrative method for writing files to the SSD is shown in FIG. 5B. In a first step, the CPU sends a write command and places data to be written to the SSD on SATA bus (step 505). The write command is transferred to the master controller, which instructs the DRAM controller to accept the data and transfer it to the DRAM memory (step 510). The DRAM controller may be configured to discriminate between commands and other data and send the commands to the master controller over a separate bus. This example, the DRAM controller sends a write commend to the master controller. When the master controller interprets the write command, it alerts the DRAM controller that new data is coming. The DRAM controller looks for the logical records in the command and searches for the logical records in its tables to determine if the data is already contained in the DRAM logical flash. For example, the current logical record maybe part of another bigger file. The DRAM controller is able to determine that the data is already in the DRAM logical flash by searching for the beginning and end logical record for each file. If the current logical record is between the beginning and end logical record for each file, the data is currently stored in the DRAM logical flash and will be overwritten. To allow for mishandled file recovery as described below, the logical record data is written in a new space in the DRAM logical flash with a notation of the address of the replaced file. However, if the logical record is not in DRAM logical flash and represents new data, a new record is created for the new logical record and the data is collected in the DRAM logical flash.

When the writing is complete with a FAT-based system, a File allocation Table (FAT) is updated and sent by the CPU over the SATA interface. In some operating systems, the storage of each FAT table entry can involve multiple, redundant write cycles. If the FAT table is requested from the SSD, the request is serviced from the DRAM logical flash. The FAT tables are stored in the DRAM logical flash and only saved to the flash memory on power down. This can save thousands of erase/write cycles in the flash memory.

In contrast, NTFS is a journaling file system. Thus, NTFS uses a log file to record metadata changes to the volume. In this way, NTFS ensures that its internal complex data structures (notably the volume allocation bitmap), or data moves performed by the defragmentation API, the modifications to MFT records (such as moves of some variable-length attributes stored in MFT records and attribute lists), and indices (for directories and security descriptors) will remain consistent in case of system crashes, and allow easy rollback of uncommitted changes to these critical data structures when the volume is remounted. As noted above, this approach results in even more frequent writing to the SSD that does the FAT system The logical flash controller sets up the SATA DMA and manages the transfer of the data into the DRAM logical flash (step 515). As discussed above, the DRAM memory used in the DRAM logical flash is extremely fast random access memory. The combination of DMA transfers, a dedicated DRAM controller, and the extremely fast DRAM memory means that data stored in the DRAM logical flash is easily and rapidly accessible to the CPU at speeds that are typically limited by the SATA bus. The DRAM logical flash is used to store data that is frequently accessed. This insulates the flash memory devices in the SSD from excessive write cycles. The logical flash controller manages the data in the DRAM as flash files, including using flash techniques to consolidate and update the data (step 520). This allows the DRAM logical flash to interface with the SATA bus in the same way as standard flash memory, but at much higher speeds.

There is no temporal correlation between SATA data and the flash data. The flash memory and data stored on the flash memory is not directly accessible to the CPU, but is controlled by master controller. The CPU interfaces only with the DRAM logical flash, with command data being transferred from the DRAM logical flash to the master controller. The logical flash controller periodically evaluates the usage of the data and determines if the data should be written from the DRAM logical flash to the NAND flash memory (step 525). For example, a file that is in use by the CPU may be saved regularly to the SSD drive during the time that the user is working with the file. After the user is finished with the file, the file can be dormant for days or months before it is again accessed. The data stored in the DRAM logical flash is written at specified save points to the NAND flash memory. For example, the data stored in the DRAM logical flash may be transferred to the NAND flash memory when the file is closed or when the computer is powered down. Other save points may occur when the capacity of the DRAM logical flash is mostly consumed. In this case, a file that is less frequently saved can be transferred to the flash memory.

The transfer of data from the DRAM logical flash to the NAND flash memory under control of the master controller will now be described. When the master controller makes the decision to write the data from the DRAM logical flash to the flash memory devices, it sends a command to the logical flash controller that identifies the data that is to be transferred and alerts the bus controller of the data transfer (step 530). The master controller places command data onto the internal bus that alerts/enables the flash controllers so that they can receive/retrieve the desired data. The logical flash controller sets the appropriate register values to configure the internal bus DMA for the transfer and the data identified by the master controller is placed on the high speed internal bus by the bus DMA (step 535). The master controller (or alternatively the optional bus controller) then begins transfer of the data with specific data segments addressed to individual flash controllers (step 540). A variety of techniques can be used to manage the transfer of data over the high speed internal bus. In one implementation, data that is loaded onto the internal bus includes a marker indicating the beginning of the data sequence, a marker indicating the end of the data sequence, and a structure than identifies the component the data is addressed to. Each flash controller watches for its identifier in the data stream and diverts the appropriate data segments to its internal storage. In other implementations, there may be a separate command/enable lines that are connected to each of the memory controllers. When data is intended for a specific flash memory module, the enable line connected to this memory controller is asserted while the enable lines for the other memory controllers are not asserted. This configuration is shown in FIG. 3.

The high speed bus operates on a clock that ensures that data transfer to and from the bus is performed at 400 MB per second. The bus controller directs transfer of the data from the DRAM logical to the flash memory devices at the full data rate of 300+MB per second. During a data transfer, the master controller sequentially directs data to a first flash register during a first DMA cycle and then to a second flash register during a second DMA cycle, and so forth. The master controller distributes the data across the eight different flash controllers sequentially (step 545). The data is sequentially read out of the registers in the flash controllers to the flash die in parallel at 40 MB per second (step 550). The registers (flash memory buffers) that are loaded have their clock switched from the bus speed to the flash speed. Eight flash controllers operating in parallel (at 40 MB per seconds for each) results in an overall transfer rate of 320 MB per second. However, the extra 20 MB per second allows for additional overhead data, such as error correcting code (ECC) to be written into the flash memory. Additionally, there may be a number of additional operations, such extra writes or reads that are performed during maintenance of the flash memory. This additional overhead makes the 40 to 50 MB transfer rates for the eight parallel flash drives approximately equal to the 400 MB per second transfer rates on the internal bus.

The SSD may also have a number of additional features. For example, the SSD may be partitioned into various sections that differing access and security levels. For example, a protected portion of the SSD may be designated for software executables. This protected portion of the SSD may not be directly accessible by the user or by the operating system. For example, the protected portion of the SSD may not be indexed by logical record numbers. Consequently, there is no mechanism for the user or the operating system to access the protected portion. Instead, the protected portion may be available only to the software supplier for loading new software and updating existing software. The protected portion can be addressed by a different technique with special commands that are specific to this type of data. For example, an address that is equivalent to a logical record could be used but be indexed on a different lookup table.

To run the software contained in the protected portion(s), the software could be transferred to a second "read only" section and accessed by the operating system. One of the advantages of this technique is that the software executables could be updated independently of what the user is doing. For example, the user may be using the Windows® operating system and a Microsoft Office® application to edit a document. In the background, the software supplier may be pushing out an update to the Windows® operating system executable stored in the protected portion of the SSD. The user's work is not interrupted. In most user situations, such as document preparation or accessing the internet, there is little or no communication traffic to/from the SSD.

Consequently, the new data can be streamed into the protected portion(s) of the SSD without adversely affecting the performance of the flash drive. The next time the user boots up the system, the new version of the operating system will be loaded from the protected portion of the drive into the "read only" section and transferred to the CPU through the DRAM logical flash. On shutdown or failure of power, there is no need for the computing system to attempt to save these executable files because they have not been changed and are already stored on the protected portion of the drive.

Additionally or alternatively there may be a special section of the drive that is designated for storing snapshots. As discussed above, snapshots are records of the complete state of the computing device at a given point in time. The snapshots allow for recovery of the computing device to that state.

Retrieving Files from the Solid State Drive

FIG. 6A is a diagram of read operations in the computing device. As discussed above, the CPU communicates directly with the DRAM logical flash over the SATA Bus and SATA DMA to retrieve data. When a read command is received, the master controller determines if the data is stored in the DRAM logical flash. If it is, the data is sent from the DRAM logical flash to the CPU. If it is not, the master controller determines where it is stored on the flash memory modules and retrieves it. In many instances, the data may be striped across multiple flash memory modules and multiple die within each module. Thus, a data file may be rapidly retrieved by simultaneously reading the data from multiple die using multiple independent controllers.

Figure 6B:
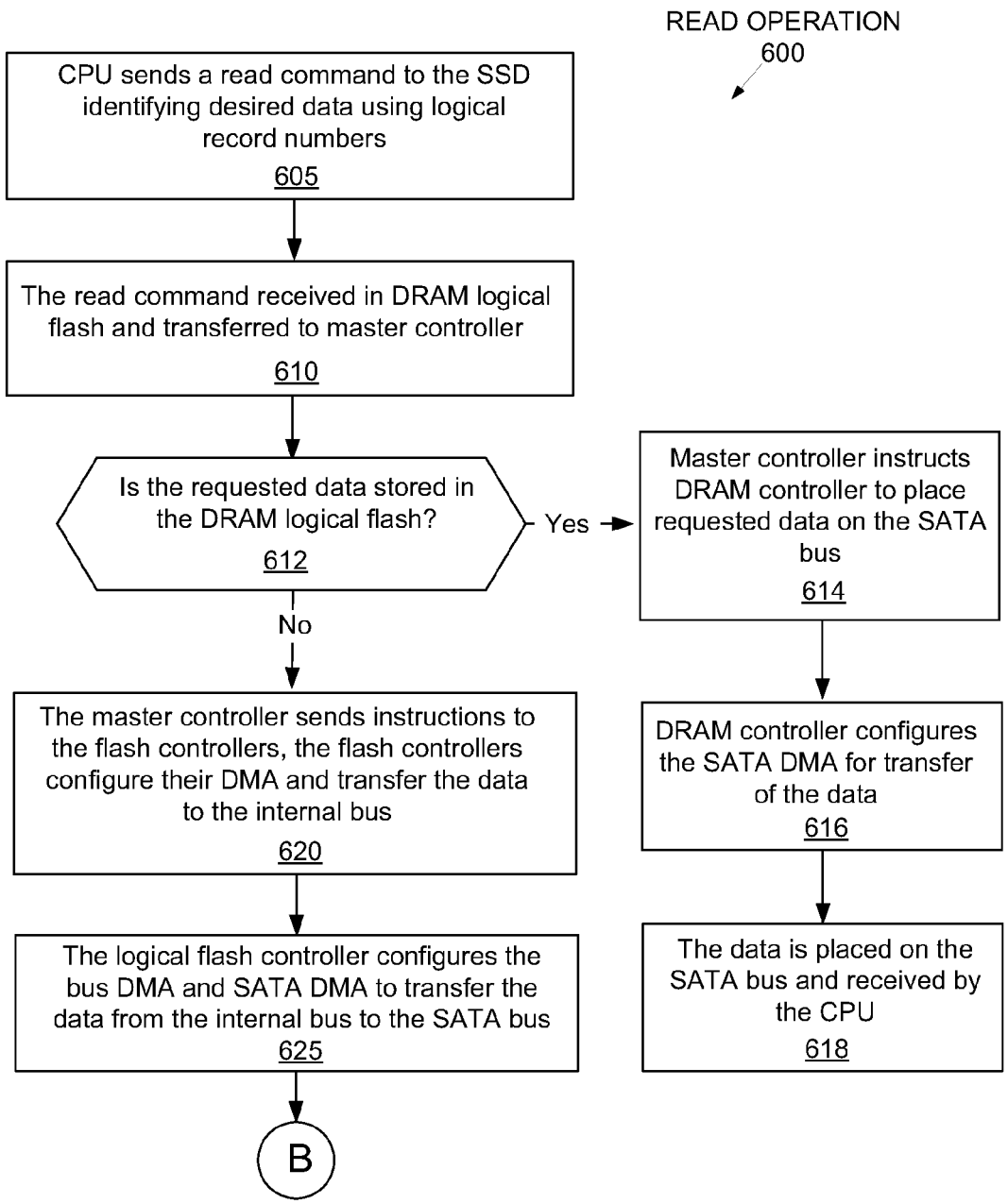
FIG. 6B is a flow chart describing a method for reading data from the solid state drive to CPU memory, according to one example of principles described herein.
Figure 6B:
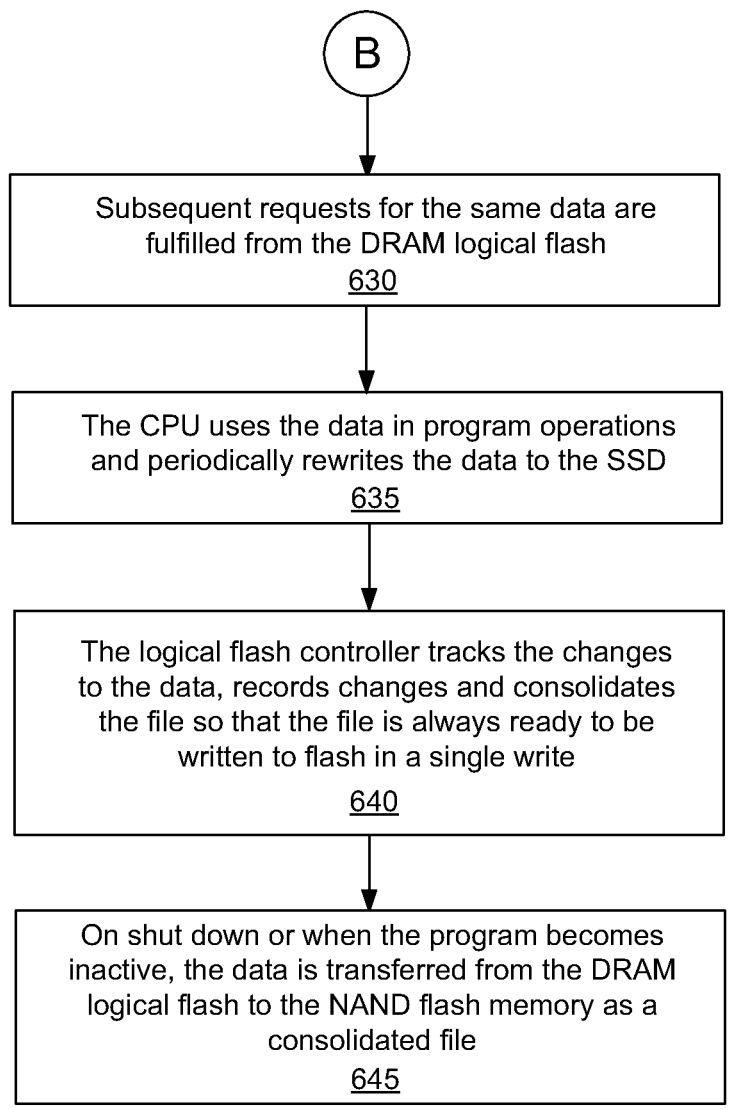

FIG. 6B is a flow chart of an illustrative method (600) for reading data from the flash memory. When a new or updated file is needed, the CPU sends a read command with logical record numbers corresponding to the needed data to the SSD via the SATA interface (step 605). The read command is received in the DRAM logical flash and transferred to the master controller (step 610). For example, the DRAM controller may be configured to recognize commands and send them to the master controller over a special high speed bus, alerting the master controller that a new command has been received. The master controller or DRAM controller determines if the requested data is stored in the DRAM logical flash (determination 612). In some implementations, the DRAM controller tracks all the files as read or written so that, in response to a request from the CPU or master controller, it can send the correct data to the SATA interface. The DRAM controller looks for the logical records in the command and searches for the logical records in its tables to determine if the data is already contained in the DRAM logical flash. If the requested data is in the DRAM logical flash ("Yes"), the master controller instructs the DRAM controller to place the requested data on the SATA bus (step 614). The DRAM configures the SATA DMA for transfer of the data (step 616). The data is placed on the SATA bus and received by the CPU (step 618).

If the requested data is not stored in the DRAM logical flash ("No"), the master controller sends instructions to the various flash controllers to place the data on the internal bus. The flash controllers configure their individual DMAs to make the transfer the data from the NAND flash die to the internal bus (step 620). The logical flash controller configures the bus DMA to receive the data and transfer it into the DRAM logical flash. The logical flash controller also configures the SATA DMA to transfer the data out of the DRAM logical flash and onto the SATA bus (step 625). This transfer from flash memory is made at 300 to 400 megabyte per second speeds. Subsequent requests for the same data are fulfilled by the DRAM logical flash instead of from the flash memory at full SATA rates (step 630). After the transfer of data from the flash memory, the DRAM logical flash allows all subsequent transactions to be performed at maximum SATA speeds (from 300 to 1000 MB per second).

The CPU uses the data in program operations and may periodically rewrite the data to the SSD (step 635). The logical flash controller tracks the changes to the data and consolidates the file so that it is always ready to be written to the NAND flash devices in a single write (step 640). If a new file is received from the CPU and it is an update to that a file that current exists in the DRAM logical flash, all of the logical records associated with the new file are written to a new location in the DRAM logical flash and the new file is written. The locations of the old data file are made available for data contained in future writes. This means that all of the current files are in one place in the DRAM so that they can be efficiently stored in the flash memory upon power down. However, if data in the DRAM logical flash has not been changed (as is the case with many executable files), there is no need to write it back to the NAND flash memory because an identical copy of it is already stored in the flash memory. Changes to the data stored in the DRAM logical flash can be designated using a "dirty bit." If the file stored in the DRAM logical flash is not changed, then the dirty bit remains unchanged and the file is not rewritten to the flash memory at a save point. If the data has been changed while it is in DRAM logical flash this indicated by the dirty bit and the data is written to the non-volatile flash memory before power down of the system (step 645). The use of a dirty bit to track changes to the data stored in the DRAM logical flash allows the system to save time and wear on the NAND flash memory. Throughout the process described above all communications are handled at the logical record level. This makes the data handling process uniform and transparent for all controllers and for the CPU.

Snapshots

Figure 7:
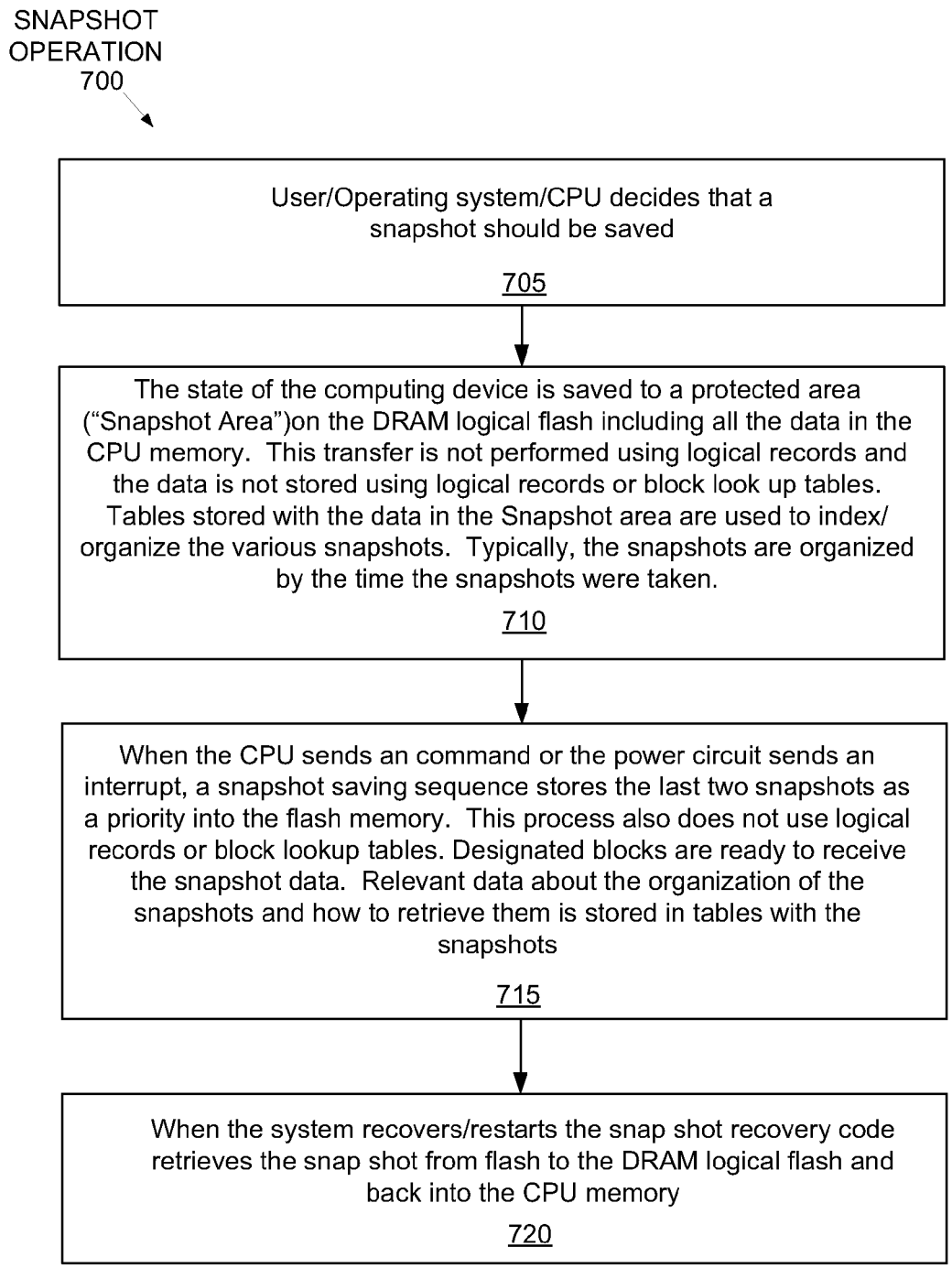
FIG. 7 is a flow chart showing a method for saving snapshot of a system state, according to one example of principles described herein.

FIG. 7 is a flow chart of an illustrative method for storing snapshots of the system state. As discussed above, incorporation of DRAM logical flash into the SSD allows for system "snap shots" and other frequent write operations to be performed by the operating systems without negatively affecting the lifetime of the flash memory. Snapshots are not transferred/stored as logical records. As discussed above with respect to FIG. 4, a special path with separate instructions is used for storing and retrieving snapshots. The snapshots are stored in a snapshot area in the DRAM logical flash and are only transferred to the flash memory at power down. The snapshots are not stored using logical records. Instead, a table called a snapshot record is used. A special path with special instructions is used for storing and retrieving snapshots. Because a separate path and instructions are used for managing snapshots, the snapshots can be saved without interfering with the normal data stream that uses logical records. Most of the snapshots are not permanently stored on the non-volatile flash memory but are temporarily stored in the DRAM logical flash. When the computing device is shut down or loses power, selected snapshots are transferred from the DRAM logical flash to the flash memory. This transfer and recovery process is coordinated by the operating system.

Now referring to FIG. 7, a user/Operating system/CPU decides that a snapshot should be saved (705). The state of the computing device is saved to a protected area ("Snapshot Area") on the DRAM logical flash. The operating system makes decisions about which data is saved. For example, there is no reason to include data in a snapshot that has previously been saved to a file. The snapshot transfer is not performed using logical records and the data is not stored using logical records or block look up tables. Tables ("snapshot records") stored with the data in the snapshot area are used to index/organize the various snapshots. Typically, the snapshots are organized by the time the snap shots were taken (710).

When the CPU sends a shut down command or the power circuit senses a loss of power and sends an interrupt, a snapshot saving sequence stores the last two snapshots as a priority into the flash memory. This process also does not use logical records or block lookup tables. Designated blocks are ready to receive the snapshot data. Relevant data about the organization of the snapshots and how to retrieve them is stored in tables with the snapshots (715).

When the system recovers/restarts, the snapshot recovery code retrieves the snap shot from flash to the DRAM logical flash and back into the CPU memory (720). The computing device can then resume operations from the state saved by the snapshot.

A program called a "recovery machine" may be included that copies periodic versions of the snap shot from flash and file data from the DRAM logical flash to a storage located, for example, in the cloud, i.e., at an address on the Internet or other computer network. The recovery machine can then be used to recover filed data that is mishandled at a later time. Accordingly, the recovery machine is given special access to the snap shot and file data. This is an illustration of the use of a DRAM SSD.

FASTLOAD Operation

FIG. 8 is a flowchart of an illustrative method (800) for fast load operations. Programs are stored in storage portion of a protected program area of flash memory in the SSD during manufacturing/configuration. The user is unable to directly access the protected program area (805). When a user receives appropriate permission to use a particular program, the program is transferred from the storage portion to the active portion of the protected program area (810).

To prepare to use one or more programs in the active area, the program files are moved into a protected program area of the DRAM logical flash. This transfer does not use logical records, but is a bulk transfer. The protected program area is similarly not directly accessible to the user (815).

The programs in the protected program area of the DRAM logical flash are transferred to the CPU memory for execution. The program files are not typically included in snapshots or dump/restore operations because the program files are not changed during execution. Files generated by the program files, including configuration and data files can be included in snapshots and dump/recovery operations (820).

Updates to the program files, including program files that the user does not yet have permission to access can be streamed from a network to the protected program area of the SSD using background operations (825). These updated programs can then be rapidly made available upon payment or authorized request by the user.

Saving Data During Power Down

FIG. 9 is a flowchart of an illustrative method (700) for saving data stored in the DRAM logical flash into non-volatile flash memory when the machine turns off or loses power. A power capacitor circuit or other energy storage device may also be included in the SSD. The energy storage device stores sufficient energy to write all the data stored in the volatile DRAM memory into the nonvolatile NAND flash memory (step 905). When there is a power interruption to the SSD a sensor in the power supply starts the power down store operation. Additionally, a power down store operation may be triggered by the user or operating system (step 910). During the power down store operation, energy from the power capacitor is used to refresh the DRAM to preserve the data, operate the controllers, transfer the data to the memory controllers, and write the data in the NAND flash memory. The master controller sets up a data path and the DRAM controller begins sending the data via the internal bus to the memory controllers. The data is written into each memory module at full speed. Each data file includes a header that identifies the file as part of a power down store operation (step 915). Each segment of data includes a logical record flag allowing the dump and recovery program to restore the logical flash data exactly as stored. Each of the eight flash memory controllers watches for its logical record flag. When a flash controller identifies its logical record flag, the controller stores the subsequent data in its flash memory (step 920). Because the dump loads the entire flash memory in sequence there are no erase cycles and the write speed can approach 300 MB per second. In theory, the complete 8 GB DRAM memory can be dumped into the flash in 24 seconds. Where the DRAM logical flash is not entirely full or contains files that have not been changed, transfer times can be significantly less. The energy storage device has a capacitive power circuit that is designed to maintain power to the SSD drive for maximum speed data transfer of all data in the DRAM logical flash to the flash memory.

In one embodiment, spare blocks in the flash die are used to store the data during the power down store operation. The spare blocks are already blank, so no erasure delays occur. The spare blocks are distributed throughout each of the die. Consequently, the snap shot is not physically located in one contiguous location. However, the header included in each of the data segments identifies the next data segment.

Consequently, by storing the first data segment in a known location, the master controller can recover all of the data files in the same order that they were written (first-in, first-out).

Before the capacitive power circuit is exhausted, pointers can be stored to help with restart. In one implementation, the master processor accumulates a directory of the logical records loaded into the flash. This directory is written on the flash memory in a protected area. When the computing device is restarted, the directory is retrieved from the protected area. The master controller then uses the table to control the operations of the logical flash.

The restore process is the reverse of the power down store process. The operating system senses the restart and causes the snapshots to be retrieved. Any necessary tables or other indexing data are first retrieved from the dump area in the flash (935). These tables may be stored in the memory of the master controller or stored in the DRAM logical flash. The master controller then uses these tables to access the snapshot and reconstruct the operating system state before the power down store operation (940). In one implementation, the first segment of data saved is transferred back to the logical flash, followed by the second segment of data and so forth until all the data is again stored on the DRAM logical flash. This operation restores a cleaned-up version of the data to the DRAM logical flash. The restored operating system then uses logical record tables to instruct the master controller to retrieve required files from the logical flash.

In general, the recovery sequence will be under control of the CPU and operating system. The operating system will instruct the loading of the various files as required. In some implementations, there may be dump references for programs that were open. If the dump references are constant, these are not rewritten. The master controller may maintain a set of bread crumbs for each open program so that the recovery process can reset the code to the last place running. However, not all programs will have bread crumbs but will be loaded as part of the recovery sequence.

Mishandled File Recovery

FIG. 10 is a flowchart of an illustrative method (1000) for recovering a mishandled data file stored in the DRAM logical flash. For example, a user may accidentally close a file without properly saving it. CPU sends instructions to the SSD to delete the file (1005).

The deletion of the file is recorded in the FAT table. However, the data in the file remains stored in the DRAM logical flash for a period of time and is indexed by a limited file history (1010). The user discovers that the file was closed without properly saving it and requests that the operating system recover the file (1015). The operating system accesses the limited file history to determine if the data that makes up the "deleted" file is still present on the DRAM logical flash (1020). If the "deleted" file is still present, it is retrieved from the DRAM logical flash and sent to the CPU memory (1025).

Conclusion

In sum, the illustrative SSD architectures described above provide plug and play alternatives to hard disk drives. A number of principles are described above that allow for flash memory to be used effectively as non-volatile storage despite its finite number of erase/write cycles. The use of DRAM logical flash simulates flash behavior, allows all flash commands to be handled at full interface speeds and minimizes writes to the NAND flash memory. As far as the system processor is concerned, it is always writing to flash memory within the SSD. However, the system processor is writing to DRAM which acts as logical flash but without the life time or addressing limitations of NAND flash memory. The DRAM logical flash stores files in the same way as flash and responds to flash commands. Further, the DRAM logical flash uses the FAT table or NTFS data structure, updates logical records, combines files, and is attached to a SATA bus. Because the DRAM logical flash has a virtually unlimited number of read/write cycles, the system processor and operating system can store as many updates and snap shots as desired. Further, the DRAM logical flash is extremely fast in both reading and writing data. The SSD stores enough power to move the entire data content stored in the DRAM logical flash to flash memory if the external power is interrupted.

The flash controllers in the SSD deal with logical record translations, error detection and recovery, and device optimization. In some embodiments, each of the flash interface devices may control 2 to 4 die for speed and ease of use. The master controller (and in some embodiments the bus controller) controls data transfer between the DRAM logical flash and each flash controller.

As discussed above, the DRAM memory and its controller make up the DRAM logical flash. The data in the DRAM logical flash is managed by the local microprocessors (DRAM controller, logical flash controller, and master controller) to fully appear to be the flash drive. All transactions for all communication with the SATA system occur only through this interface. The DRAM logical flash always reads from and writes to the SATA bus at full SATA speed. Thus, the DRAM logical flash fully appears to be a flash device but has significantly higher data transfer rates. This makes the SSD operation transparent to the computing device, which can function just as if it were writing to a standard flash or hard drive device.

The DRAM logical flash is not a cache and does not function as cache. The files in the DRAM logical flash are written just as they would be in flash, with logical record to physical location mapping and file management. The DRAM controller accepts flash commands and implements them such that CPU always believes it is writing to flash memory drive. However, the CPU is always reading and writing to the DRAM logical flash. The CPU does not directly access the flash memory. The flash is written to only at specific predetermined points determined by the master controller. These points are independent of the CPU commands and cannot be directly triggered by the CPU.

The implementations given above are only illustrative examples of principles described herein. A variety of other configurations and architectures can be used. For example, the functions of the DRAM controller and logical flash controller could be combined into a single controller. In other implementations, the functions of the master controller and bus controller could be combined. The number and type of buses, volatile memory, and nonvolatile memory devices could be varied to accommodate various design parameters and new technologies. For example, although a SATA bus, DRAM memory, and NAND memory are described in the example above, a variety of other bus and memory technologies could be used.

Additionally, the architecture shown in FIGS. 1-4 and described above is only an example. A number of alternative architectures could be used. Although the principles discussed above show a DRAM logical flash that acts as a gatekeeper between a CPU and a bank of flash memory, the DRAM logical flash could also be interposed between a CPU and a conventional spinning platter hard drive or other nonvolatile memory.

Consequently, the SSD is a drop in replacement for standard hard drives and does not require any programming or physical changes to the computing device.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A solid state drive (SSD) comprising:
Dynamic Random Access Memory (DRAM);
flash memory;
an SSD controller; and
an interface to connect the SSD to a host having a Central Processing Unit (CPU) such that CPU exclusively reads data from, and writes to, the DRAM, the DRAM providing principal data storage during operation of the CPU;
the SSD controller to independently determine when to transfer data from the DRAM to the flash memory,
wherein, upon restart, the SSD controller to retrieve a stored snapshot of an operating state of the host at power down from the flash memory into the DRAM, comprising retrieving indexing data from a dump area of the flash memory and using the indexing data to load separate segments of the snapshot from the flash memory to the DRAM to restore a cleaned-up version of the snapshot in the DRAM for use by an operating system of the host.

2. A solid state drive (SSD) comprising:
Dynamic Random Access Memory (DRAM) configured to function as logical flash;
non-volatile flash memory to receive data from the DRAM;
a bus;
in which a Central Processing Unit of a host device reads and writes only to the DRAM and not the flash memory using the bus;
in which at least some writes to the drive are reported to the host device as stored in the non-volatile flash memory even though data from those writes is actually stored in the DRAM;
wherein, upon restart, the SSD to retrieve a stored snapshot of an operating state of the host device at power down from the flash memory into the DRAM, comprising retrieving indexing data from a dump area of the flash memory and using the indexing data to load separate segments of the snapshot from the flash memory to the DRAM to restore a cleaned-up version of the snapshot in the DRAM for use by an operating system of the host device.

3. The drive of claim 2, in which the solid state drive writes data from the DRAM to the flash memory at predetermined points that are independent from commands issued by a system processor.

4. The drive of claim 2, in which the DRAM simulates flash memory by storing files in the same way as NAND flash and responds to flash commands.

5. The drive of claim 4, in which the DRAM simulates flash memory by using a FAT table or NTFS controls, updating logical records, combining files, and directly connecting to a SATA or PCI bus.

6. The drive of claim 1, further comprising an energy storage device storing enough power to move data content stored in the DRAM to flash memory if external power to the solid state drive is interrupted.

7. The drive of claim 1, in which the DRAM implements all read and write commands at full interface speed.

8. The drive of claim 1, in which the DRAM stores program trace points and operation snapshots used by the SSD controller to minimize writes to the flash memory.

9. The drive of claim 1, in which the solid state drive is configured to provide a full recovery of a last state of the host for any power down.

10. The drive of claim 1, in which pages of the flash memory are individually identified as having errors and eliminated from a block while other pages in the block remain in use.

11. The drive of claim 10, in which the flash memory comprises multi-level cell NAND flash, in which individually identifying pages as having errors and eliminating them from a block while other pages in the block remain in use increases the lifetime of the flash memory over flash memory that eliminates an entire block when an error is detected in a page within the block.

12. The drive of claim 1, in which all data retained in the DRAM is written to the flash memory in response to a power down of the host.

13. The drive of claim 2, further comprising high speed Direct Memory Access (DMA) for independent read and write operations to the DRAM.

14. The drive of claim 1, further comprising a high speed internal bus, in which the DRAM and the flash memory are separately connected to the high speed internal bus, the flash memory being divided into separate modules, each module controlled by a different microprocessor configured to independently interface with the high speed internal bus.

15. The drive of claim 2, in which the DRAM simulates flash memory storage by storing all the transfers to the flash memory and selectively holding the transfers to minimize write wear on the flash memory.

16. The drive of claim 1, in which the SSD controller controls execution of a command by sending sub-commands to other microprocessors without the SSD controller directly managing data transfers, in which each microprocessor operates independently.

17. The drive of claim 2, further comprising:
an internal bus operably connecting the DRAM and the flash memory; and
a master controller controlling data that sent over the internal bus between the DRAM and the flash memory.

18. The drive of claim 2, further comprising multiple independent flash controllers each within a separate flash memory module such that the separate flash memory modules can be written in parallel.

19. The drive of claim 18, in which each of the flash memory modules comprise:
a microprocessor;
flash memory;
memory buffers directly accessible to the microprocessor and flash memory;
an interface for writing data directly into the memory buffers; and
a buffer switch to switch the memory buffers between an external bus and an internal bus by transitioning to a null state.

20. The drive of claim 1, wherein the DRAM is configured to operate in at least one of the following modes: logical record indexed data transfers and data transfers that are not indexed by logical records.

21. The drive of claim 2, wherein the DRAM provides principal data storage during operation of the CPU wherein a portion of data written to the DRAM is not written to the flash memory.

22. A method for operation of a solid state drive (SSD) that comprises Dynamic Random Access Memory (DRAM) and a flash device comprising:
  writing, by a Central Processing Unit (CPU) of a host device, to the solid state drive by sending commands and data to the DRAM, in which the DRAM is treated by the CPU as nonvolatile memory and as logical flash;
  minimizing wear on the flash device by independently determining with an SSD controller when and whether to transfer data from the DRAM to the flash device;
  in response to a loss of external power to the SSD, using a power system contained in the SSD to transfer data from the DRAM to the flash device; and
  upon restart, retrieving a stored snapshot of an operating state of the host device at power down from the flash device into the DRAM, comprising retrieving indexing data from a dump area of the flash device and using the indexing data to load separate segments of the snapshot from the flash device to the DRAM to restore a cleaned-up version of the snapshot in the DRAM for use by an operating system of the host device.

23. The method of claim 22, further comprising simulating flash memory by the DRAM logical flash by:
  storing files in the same way as NAND flash in the DRAM logical flash; and
  responding, with the DRAM logical flash, to flash commands.

24. The method of claim 23, further comprising simulating flash memory by the DRAM logical flash by:
  using a FAT table or NTFS data structure;
  updating logical records;
  combining files; and
  directly connecting to a SATA or PCI bus.

25. The method of claim 22, further comprising:
  determining that a snapshot of a system state should be saved; and
  saving the snapshot in a snapshot area of the DRAM logical flash using a dedicated file transfer route that does not use logical record numbers;
  when solid state drive shuts down, saving at least one selected snapshot to the flash memory modules.

26. The method of claim 22, further comprising reading data from the solid state flash device by:
  receiving a read command from the CPU by a master controller in the solid state flash device;
  determining, with the master controller, if files requested by the read command are stored in the DRAM logical flash;
  if the files are stored in the DRAM logical flash, then transferring the files to the CPU.

27. The method of claim 22, further comprising writing to the solid state flash device by:
  sending, by the CPU, a write command and placing the data to be written on a system bus;
  receiving, by the solid state flash device, the write command and accepting the data from the system bus;
  storing the data on the DRAM logical flash; and
  reporting to the CPU that the write to non-volatile memory is complete; and
  further comprising, if the master controller determines that the data in the DRAM logical flash is not being used, then sending the data to the flash memory modules by:
  sequentially enabling flash memory modules; and
  transferring the data on an internal bus sequentially to enabled flash memory modules;
  in which the data is striped over all of the flash memory modules to allow for parallel writes to the flash memory modules.

28. The method of claim 22, further comprising a fast load operation comprising storing software executables on a protected area of the DRAM logical flash that is not accessible to the user.

29. The drive of claim 1, wherein the DRAM comprises at least 8 Gigabytes of data storage.

30. The drive of claim 2, wherein the DRAM comprises at least 8 Gigabytes of data storage.

* * * * *